(12) United States Patent
Kumaki et al.

(10) Patent No.: US 8,796,670 B2
(45) Date of Patent: Aug. 5, 2014

(54) LIGHT-EMITTING ELEMENT

(75) Inventors: Daisuke Kumaki, Tokamachi (JP); Satoshi Seo, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 474 days.

(21) Appl. No.: 10/580,535

(22) PCT Filed: Dec. 17, 2004

(86) PCT No.: PCT/JP2004/019466
§ 371 (c)(1),
(2), (4) Date: May 25, 2006

(87) PCT Pub. No.: WO2005/064995
PCT Pub. Date: Jul. 14, 2005

(65) Prior Publication Data
US 2007/0114527 A1    May 24, 2007

(30) Foreign Application Priority Data
Dec. 26, 2003    (JP) .................................. 2003-432306

(51) Int. Cl.
*H01L 29/08*    (2006.01)
*H01L 35/24*    (2006.01)
*H01L 51/00*    (2006.01)

(52) U.S. Cl.
USPC  257/40; 257/103; 257/E51.042; 257/E51.043; 257/E51.048; 313/504; 313/506; 428/690; 428/917; 445/24

(58) Field of Classification Search
USPC ..................... 257/40, 103, E51.042, E51.043, 257/E51.048; 313/506, 504; 428/690, 917; 445/24
See application file for complete search history.

(56) References Cited

U.S. PATENT DOCUMENTS 5,404,075 A    4/1995   Fujikawa et al.
5,457,565 A    10/1995  Namiki et al.
(Continued)

FOREIGN PATENT DOCUMENTS

CN    1327360 A    12/2001
CN    1620212      5/2005
(Continued)

OTHER PUBLICATIONS

International Search Report (Application No. PCT/JP2004/019466) dated Apr. 12, 2005.
(Continued)

*Primary Examiner* — Meiya Li
(74) *Attorney, Agent, or Firm* — Eric J. Robinson; Robinson Intellectual Property Law Office, P.C.

(57) ABSTRACT

In the present invention, a light-emitting element operating at low driving voltage, consuming low power, emitting light with good color purity and manufactured in high yields can be obtained. A light-emitting element is disclosed with a configuration composed of a fist layer containing a light-emitting material, a second layer, a third layer are formed sequentially over an anode to be interposed between the anode and a cathode in such a way that the third layer is formed to be in contact with the cathode. The second layer is made from n-type semiconductor, a mixture including that, or a mixture of an organic compound having a carrier transporting property and a material having a high electron donor property. The third layer is made from p-type semiconductor, a mixture including that, or a mixture of an organic compound having a carrier transporting property and a material having a high electron acceptor property.

18 Claims, 17 Drawing Sheets

(56) References Cited

U.S. PATENT DOCUMENTS

| | | | |
|---|---|---|---|
| 5,757,026 A * | 5/1998 | Forrest et al. | 257/40 |
| 5,853,905 A | 12/1998 | So et al. | |
| 5,886,365 A | 3/1999 | Kouchi et al. | |
| 5,925,980 A | 7/1999 | So et al. | |
| 5,989,737 A | 11/1999 | Xie et al. | |
| 5,994,836 A | 11/1999 | Boer et al. | |
| 6,013,384 A | 1/2000 | Kido et al. | |
| 6,130,001 A | 10/2000 | Shi et al. | |
| 6,316,874 B1 | 11/2001 | Arai et al. | |
| 6,323,515 B1 | 11/2001 | Yamazaki et al. | |
| 6,366,017 B1 | 4/2002 | Antoniadis et al. | |
| 6,380,687 B1 | 4/2002 | Yamazaki | |
| 6,395,409 B2 | 5/2002 | Ueda et al. | |
| 6,416,888 B1 | 7/2002 | Kawamura et al. | |
| 6,423,429 B2 | 7/2002 | Kido et al. | |
| 6,483,236 B1 | 11/2002 | Hung | |
| 6,486,601 B1 | 11/2002 | Sakai et al. | |
| 6,489,638 B2 | 12/2002 | Seo et al. | |
| 6,509,109 B1 | 1/2003 | Nakamura et al. | |
| 6,518,700 B1 | 2/2003 | Friend et al. | |
| 6,521,359 B1 | 2/2003 | Noguchi et al. | |
| 6,525,466 B1 | 2/2003 | Jabbour et al. | |
| 6,552,496 B2 | 4/2003 | Yamazaki | |
| 6,566,807 B1 * | 5/2003 | Fujita et al. | 313/506 |
| 6,573,650 B2 | 6/2003 | Aoki et al. | |
| 6,579,629 B1 | 6/2003 | Raychaudhuri et al. | |
| 6,589,673 B1 | 7/2003 | Kido et al. | |
| 6,593,691 B2 | 7/2003 | Nishi et al. | |
| 6,602,619 B2 | 8/2003 | Lin et al. | |
| 6,608,449 B2 | 8/2003 | Fukunaga | |
| 6,611,108 B2 | 8/2003 | Kimura | |
| 6,635,365 B2 | 10/2003 | Kawamura et al. | |
| 6,642,544 B1 | 11/2003 | Hamada et al. | |
| 6,650,047 B2 | 11/2003 | Aoki et al. | |
| 6,670,637 B2 | 12/2003 | Yamazaki et al. | |
| 6,674,136 B1 | 1/2004 | Ohtani | |
| 6,677,613 B1 | 1/2004 | Yamazaki et al. | |
| 6,689,492 B1 | 2/2004 | Yamazaki et al. | |
| 6,690,033 B2 | 2/2004 | Yamazaki et al. | |
| 6,692,845 B2 | 2/2004 | Maruyama et al. | |
| 6,730,966 B2 | 5/2004 | Koyama | |
| 6,738,034 B2 | 5/2004 | Kaneko et al. | |
| 6,773,830 B2 | 8/2004 | Aziz et al. | |
| 6,774,573 B2 | 8/2004 | Yamazaki | |
| 6,794,278 B2 | 9/2004 | Kido et al. | |
| 6,806,640 B2 | 10/2004 | Okada et al. | |
| 6,830,494 B1 | 12/2004 | Yamazaki et al. | |
| 6,831,408 B2 | 12/2004 | Hirano et al. | |
| 6,869,635 B2 | 3/2005 | Kobayashi | |
| 6,881,502 B2 * | 4/2005 | Liao et al. | 428/690 |
| 6,905,788 B2 | 6/2005 | Tyan et al. | |
| 6,917,159 B2 * | 7/2005 | Tyan et al. | 313/506 |
| 6,936,961 B2 | 8/2005 | Liao et al. | |
| 6,942,534 B2 | 9/2005 | Shibasaki et al. | |
| 6,946,319 B2 | 9/2005 | Stegamat et al. | |
| 6,956,240 B2 | 10/2005 | Yamazaki et al. | |
| 6,982,179 B2 | 1/2006 | Kwong et al. | |
| 7,074,500 B2 | 7/2006 | Pfeiffer et al. | |
| 7,141,817 B2 | 11/2006 | Nishi et al. | |
| 7,158,161 B2 | 1/2007 | Gyoutoku et al. | |
| 7,180,089 B2 | 2/2007 | Wu et al. | |
| 7,239,081 B2 | 7/2007 | Tsutsui | |
| 7,256,422 B2 | 8/2007 | Yamazaki | |
| 7,323,225 B2 | 1/2008 | Aoki et al. | |
| 7,462,372 B2 | 12/2008 | Konuma et al. | |
| 7,488,986 B2 | 2/2009 | Yamazaki et al. | |
| 7,728,516 B2 | 6/2010 | Kawaguchi et al. | |
| 7,732,808 B2 | 6/2010 | Ikeda et al. | |
| 7,745,991 B2 | 6/2010 | Yamazaki et al. | |
| 7,785,718 B2 | 8/2010 | Yatsunami et al. | |
| 2001/0053559 A1 | 12/2001 | Nagao et al. | |
| 2002/0030443 A1 | 3/2002 | Konuma et al. | |
| 2003/0080338 A1 | 5/2003 | Yamazaki et al. | |
| 2003/0111666 A1 | 6/2003 | Nishi et al. | |
| 2003/0189401 A1 | 10/2003 | Kido et al. | |
| 2004/0140758 A1 | 7/2004 | Raychaudhuri et al. | |
| 2004/0150333 A1 * | 8/2004 | Tsutsui | 313/512 |
| 2004/0161192 A1 | 8/2004 | Hamano et al. | |
| 2004/0185299 A1 | 9/2004 | Ly | |
| 2004/0227460 A1 * | 11/2004 | Liao et al. | 313/506 |
| 2005/0035708 A1 | 2/2005 | Yamazaki et al. | |
| 2005/0040392 A1 * | 2/2005 | Wu et al. | 257/40 |
| 2005/0067951 A1 | 3/2005 | Richter et al. | |
| 2005/0084712 A1 | 4/2005 | Kido et al. | |
| 2005/0084713 A1 | 4/2005 | Kido et al. | |
| 2005/0098207 A1 * | 5/2005 | Matsumoto et al. | 136/263 |
| 2005/0106419 A1 | 5/2005 | Endoh et al. | |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2007/0200125 A1 | 8/2007 | Ikeda et al. | |
| 2007/0221912 A1 | 9/2007 | Jeong et al. | |
| 2008/0203385 A1 | 8/2008 | Saito et al. | |

FOREIGN PATENT DOCUMENTS

| | | |
|---|---|---|
| EP | 0 855 848 | 7/1998 |
| EP | 0948063 A | 10/1999 |
| EP | 0949696 A | 10/1999 |
| EP | 11-354283 A | 12/1999 |
| EP | 1009198 A | 6/2000 |
| EP | 1065723 A | 1/2001 |
| EP | 1083776 A | 3/2001 |
| EP | 1 089 361 | 4/2001 |
| EP | 1093167 A | 4/2001 |
| EP | 1128438 A | 8/2001 |
| EP | 1 160 891 | 12/2001 |
| EP | 1179862 A | 2/2002 |
| EP | 1261042 A | 11/2002 |
| EP | 1311139 A | 5/2003 |
| EP | 1318553 A | 6/2003 |
| EP | 1 351 558 | 10/2003 |
| EP | 1 524 706 | 4/2005 |
| EP | 1524707 A | 4/2005 |
| EP | 1 530 245 | 5/2005 |
| EP | 1865566 | 12/2007 |
| EP | 1919008 A | 5/2008 |
| EP | 2254155 A | 11/2010 |
| JP | 58-044422 A | 3/1983 |
| JP | 01-312873 A | 12/1989 |
| JP | 02-139892 A | 5/1990 |
| JP | 02-288092 | 11/1990 |
| JP | 03-114197 A | 5/1991 |
| JP | 03-190088 A | 8/1991 |
| JP | 03-274695 | 12/1991 |
| JP | 04-357694 A | 12/1992 |
| JP | 05-182766 A | 7/1993 |
| JP | 06-089040 | 3/1994 |
| JP | 06-267658 | 9/1994 |
| JP | 06-290873 A | 10/1994 |
| JP | 06-312979 | 11/1994 |
| JP | 06-346049 | 12/1994 |
| JP | 07-312289 A | 11/1995 |
| JP | 08-288064 A | 11/1996 |
| JP | 09-063771 | 3/1997 |
| JP | 10-255985 A | 9/1998 |
| JP | 10-270171 | 10/1998 |
| JP | 10-308284 A | 11/1998 |
| JP | 2824411 A | 11/1998 |
| JP | 11-162647 A | 6/1999 |
| JP | 11-251067 A | 9/1999 |
| JP | 11-251068 A | 9/1999 |
| JP | 11-297474 | 10/1999 |
| JP | 11-307259 | 11/1999 |
| JP | 11-307264 | 11/1999 |
| JP | 2000-215984 A | 8/2000 |
| JP | 2000-223276 A | 8/2000 |
| JP | 2000-235893 A | 8/2000 |
| JP | 2000-315580 A | 11/2000 |
| JP | 2000-315581 A | 11/2000 |
| JP | 2001-043980 A | 2/2001 |
| JP | 2001-076868 A | 3/2001 |
| JP | 2001-102175 | 4/2001 |
| JP | 2001-185354 A | 7/2001 |

(56) References Cited

FOREIGN PATENT DOCUMENTS

| | | |
|---|---|---|
| JP | 2001-244079 A | 9/2001 |
| JP | 2002-015867 A | 1/2002 |
| JP | 2002-015873 | 1/2002 |
| JP | 2002-075658 A | 3/2002 |
| JP | 2002-332567 A | 11/2002 |
| JP | 2002-359086 A | 12/2002 |
| JP | 2002-367784 A | 12/2002 |
| JP | 2003-157980 A | 5/2003 |
| JP | 2003-229278 | 8/2003 |
| JP | 2003-249357 A | 9/2003 |
| JP | 2003-257674 A | 9/2003 |
| JP | 2003-264085 A | 9/2003 |
| JP | 2003-272860 | 9/2003 |
| JP | 2003-282259 A | 10/2003 |
| JP | 2004-026732 | 1/2004 |
| JP | 2004-134395 A | 4/2004 |
| JP | 2004-514257 A | 5/2004 |
| JP | 2004-323509 | 11/2004 |
| JP | 2004-349007 A | 12/2004 |
| JP | 2005-026121 A | 1/2005 |
| JP | 2005-032618 A | 2/2005 |
| JP | 2005-123094 A | 5/2005 |
| JP | 2005-123095 A | 5/2005 |
| JP | 2005-251587 A | 9/2005 |
| WO | WO-00/01203 | 1/2000 |
| WO | WO-01/15244 A | 3/2001 |
| WO | WO-02/41414 A | 5/2002 |
| WO | WO-2005/006460 A | 1/2005 |

OTHER PUBLICATIONS

Written Opinion (Application No. PCT/JP2004/019466) dated Apr. 12, 2005.

T. Nakada et al., *Multi Photon Emission Organic EL Devices Using Charge-Transfer Complex as Charge Generation Layer*, Precedings of the Lecture Meeting of the Union Allied With the Japan Society of Applied Physics, The 63$^{rd}$ Autumn Meeting, Sep. 24, 2002, vol. 27a-ZL-12, p. 1165.

S. Tokito et al., *Metal Oxides as a Hole-Injecting Layer for an Organic Electroluminescent Device*, J. Appl. Phys. (Journal of Applied Physics), vol. 29, Jan. 1, 1996, pp. 2750-2753.

Noh et al., "17.1: Invited Paper: Inverted OLED," SID Digest 2008: SID International Symposium Digest of Technical Papers, 2008, pp. 212-214.

S. Tokito et al., *Metal Oxides as a Hole-Injecting Layer for an Organic Electroluminescent Device*, J. Phys.D: Appl. Phys. (Journal of Physics D: Applied Physics), vol. 29, Jan. 1, 1996, pp. 2750-2753.

Chinese Office Action (Application No. 200910170468.4) Dated Oct. 29, 2010.

\* cited by examiner

PRIOR ART

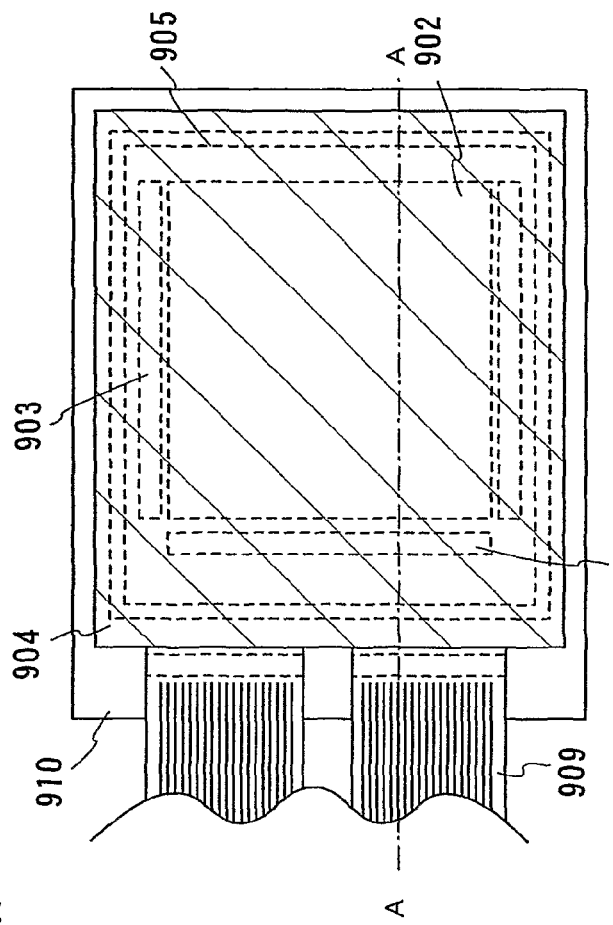
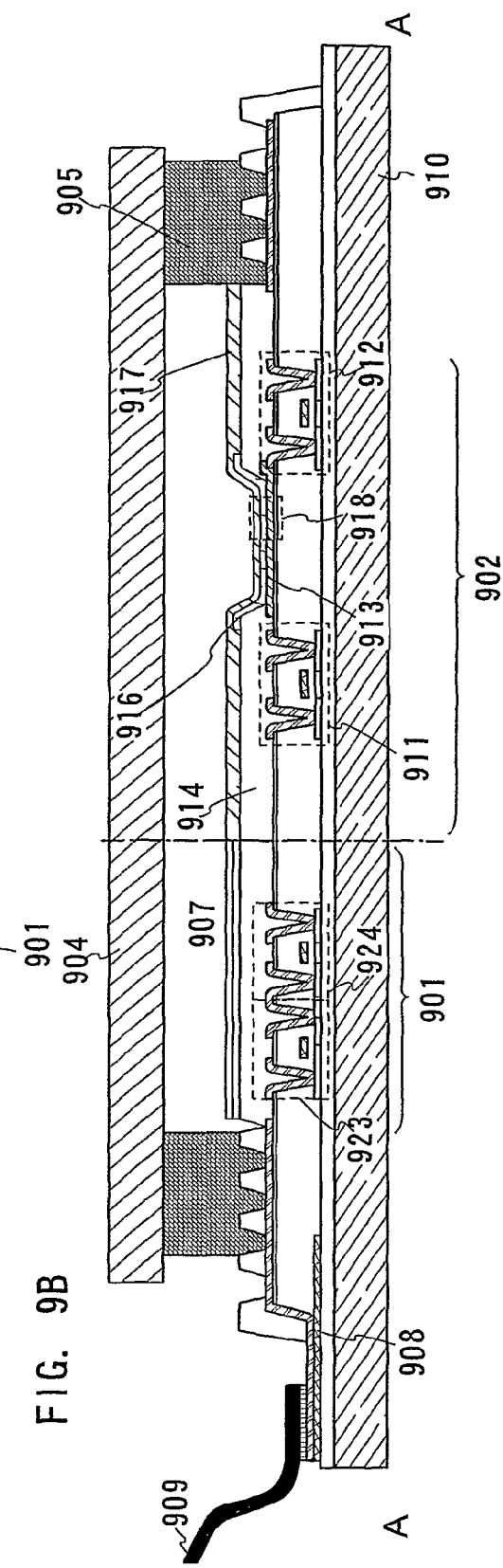
FIG. 9A
FIG. 9B

LIGHT-EMITTING ELEMENT

TECHNICAL FIELD

The present invention relates to a layered structure of a light-emitting element that has a layer containing a light-emitting material between an anode and a cathode and that can emit light upon being applied with an electric field.

BACKGROUND ART

As examples of a photoelectronic device using an organic semiconductor material as a functional organic material, a light-emitting element, solar battery, and the like can be nominated. These are devices utilizing an electrical property (carrier transporting property) or an optical property (light absorption or light-emitting property) of the organic semiconductor material. Among others, a light-emitting element has achieved remarkable development.

A light-emitting element comprises a pair of electrodes (anode and cathode) and a layer containing a light-emitting material interposed between the pair of electrodes. The emission mechanism is as follows. Upon applying voltage through the pair of electrodes, holes injected from the anode and electrons injected from the cathode are recombined with each other at an emission center within the layer containing a light-emitting material to lead the formation of molecular excitons, and the molecular excitons return to the ground state while radiating energy as light. There are two excited states possible from the light-emitting material, a singlet state and a triplet state. It is considered that light emission can be obtained through both the singlet state and the triplet state.

Lately, the reduction of driving voltage is successful (see Unexamined Patent Publication No. 10-270171) by forming an electron injecting layer made from an organic compound doped with metal having a low work function (metal having an electron donor property) such as an alkali metal, an alkaline earth metal, or a rare earth metal to lower an energy barrier in injecting electrons from a cathode to an organic compound. According to this technique, driving voltage can be reduced despite of using stabilized metal such as Al for forming the cathode.

By using the application of the technique, the control of an emission spectrum of a light-emitting element is successful (see Unexamined Patent Publication No. 2001-102175). In the Unexamined Patent Publication No. 2001-102175, an electron injecting layer made from an organic compound doped with metal having electron donor property for the organic compound is provided. The Unexamined Patent Publication has disclosed that the thickness of the electron injecting layer is increased to vary the optical path between a cathode and a light-emitting layer, so that an emission spectrum emitted to outside can be controlled due to the effect of interference of light.

According to the Unexamined Patent Publication No. 2001-102175, the increase of driving voltage is small by adopting the foregoing electron injecting layer despite of increasing the thickness of the electron injecting layer in order to control an emission spectrum. However, in fact, unless a peculiar organic compound serving as a ligand such as bathocuproin (BCP) is used, driving voltage is drastically increased.

Therefore, the technique with respect to an electron injecting layer disclosed in the Unexamined Patent Publications Nos. 10-270171 and 2001-102175 has a problem that even if the thickness of the electron injecting layer is increased to improve a manufacturing yield, or to control an emission spectrum so that color purity is improved, power consumption is increased unless an organic compound serving as a ligand is selected to use.

A principle of operation of a light-emitting element disclosed in the Unexamined Patent Publications Nos. 10-270171 and 2001-102175 is explained hereinafter with reference to FIG. 2.

FIG. 2 illustrates a basic configuration of the conventional light-emitting element using an electron injecting layer as disclosed in the Unexamined Patent Publications Nos. 10-270171 and 2001-102175.

In the conventional light-emitting element (FIG. 2), holes injected from an anode 201 and electrons injected from a cathode 204 are recombined upon being applied with forward bias to emit light within a layer containing a light-emitting material 202. In this instance, an electron injecting layer 203 is made from an organic compound doped with metal having a high electron donor property for the organic compound (alkali metal or alkali earth metal).

The electron injecting layer 203 serves for flowing electrons to inject them to the layer containing a light-emitting material 202. However, since electron mobility of an organic compound is two orders of magnitude less than hole mobility of that, driving voltage is increased if the electron injecting layer is formed to have a thickness comparable in a wavelength of visible light (on the order of submicron) in order, for example, to control an emission spectrum.

DISCLOSURE OF INVENTION

In view of the foregoing, it is an object of the present invention to provide a light-emitting element capable of being increased its thickness and operating at low driving voltage by a novel means different from a light-emitting element using a material serving as a ligand in accordance with the prior art. It is more specific object of the present invention to provide a light-emitting element that consumes low power and emits light with good color purity. It is still more specific object of the present invention to provide a light-emitting element that consumes low power and is manufactured in high yields.

The inventor found out after their earnest consideration that the foregoing problems can be solved by providing a light-emitting element having the following configuration.

One embodiment of the present invention provides a light-emitting element comprising an anode and a cathode; and a first layer containing a light-emitting material, a second layer containing n-type semiconductor, and a third layer containing p-type semiconductor, the layers each being interposed between the pair of electrodes; wherein the first layer, the second layer, and the third layer are sequentially formed over the anode to be interposed between the anode and the cathode in such a way that the third layer is formed to be in contact with the cathode.

The n-type semiconductor is preferably metal oxide, specifically, a compound or two or more compounds selected from the group consisting of zinc oxide, tin oxide, and titanium oxide. The p-type semiconductor is preferably metal oxide, specifically, a compound or two or more compounds selected from the group consisting of vanadium oxide, chromium oxide, molybdenum oxide, cobalt oxide, and nickel oxide.

Another embodiment of the present invention provides a light-emitting element comprising an anode and a cathode; and a first layer containing a light-emitting material, a second layer containing an organic compound and a material having an electron donor property, and a third layer containing p-type semiconductor, the layers each being interposed between the pair of electrodes; wherein the first layer, the second layer, and the third layer are sequentially formed over the anode to be interposed between the anode and the cathode in such a way that the third layer is formed to be in contact with the cathode.

The p-type semiconductor is preferably metal oxide, specifically, a compound or two or more compounds selected from the group consisting of vanadium oxide, chromium oxide, molybdenum oxide, cobalt oxide, and nickel oxide. In the second layer, the organic compound is preferably an organic compound having an electron transporting property, specifically, a metal complex having a ligand with a π-conjugated skeleton. The material having an electron donor property is preferably an alkali metal, an alkali earth metal, or a rare earth metal.

More another embodiment of the present invention provides a light-emitting element comprising an anode and a cathode; and a first layer containing a light-emitting material, a second layer containing n-type semiconductor, and a third layer containing an organic compound and a material having an electron acceptor property, the layers each being interposed between the pair of electrodes; wherein the first layer, the second layer, and the third layer are sequentially formed over the anode to be interposed between the anode and the cathode in such a way that the third layer is formed to be in contact with the cathode.

The n-type semiconductor is preferably metal oxide, specifically, a compound or two or more compounds selected from the group consisting of zinc oxide, tin oxide, and titanium oxide. In the third layer, the organic compound is preferably an organic compound having a hole transporting property, specifically, an organic compound having an aromatic amine skeleton. The material having an electron acceptor property is preferably metal oxide.

Still more another embodiment of the present invention provides a light-emitting element comprising an anode and a cathode; and a first layer containing a light-emitting material, a second layer containing a first organic compound and a material having an electron donor property, and a third layer containing a second organic compound and a material having an electron acceptor property, the layers each being interposed between the pair of electrodes; wherein the first layer, the second layer, and the third layer are sequentially formed over the anode to be interposed between the anode and the cathode in such a way that the third layer is formed to be in contact with the cathode.

The organic compound is preferably an organic compound having an electron transporting property, specifically, a metal complex having a ligand with a π-conjugated skeleton. The material having an electron donor property is preferably an alkali metal, an alkali earth metal, or a rare earth metal. Further, the second organic compound is preferably an organic compound having a hole transporting property, specifically, an organic compound having an aromatic amine skeleton. The material having an electron acceptor property is preferably metal oxide.

Further still more another embodiment of the present invention provides a light-emitting element comprising an anode and a cathode; and a first layer containing a light-emitting material, a second layer containing an organic compound and metal, and a third layer made from metal oxide, the layers each being interposed between the pair of electrodes; wherein the first layer, the second layer, and the third layer are sequentially formed over the anode to be interposed between the anode and the cathode in such a way that the third layer is formed to be in contact with the cathode. Alternatively, a light-emitting element is provided that comprises an anode and a cathode; and a first layer containing a light-emitting material, a second layer containing an organic compound and metal, and a third layer containing an organic compound that is different from the foregoing organic compound and metal oxide, the layers each being interposed between the pair of electrodes; wherein the first layer, the second layer, and the third layer are sequentially formed over the anode to be interposed between the anode and the cathode in such a way that the third layer is formed to be in contact with the cathode.

The organic compound contained in the second layer is preferably an organic compound having an electron transporting property, specifically, a metal complex having a ligand with a π-conjugated skeleton. Further, the second organic compound contained in the third layer is preferably an organic compound having a hole transporting property, specifically, an organic compound having an aromatic amine skeleton. The metal is preferably an alkali metal, an alkali earth metal, or a rare earth metal. The metal oxide is preferably a compound or two or more compounds selected from the group consisting of vanadium oxide, chromium oxide, molybdenum oxide, cobalt oxide, and nickel oxide.

Despite of using sputtering for forming the cathode in the light-emitting element according to the present invention, a light-emitting element having good characteristics and being suffered from little damage due to the sputtering can be obtained. Therefore, a cathode can be formed by using a conductive material that is transparent to visible light such as ITO (Indium Tin Oxide) that is mainly formed by sputtering. In the case of using such the transparent electrode made from a conductive material transparent to visible light, a light-emitting element that can emit light from a cathode can be obtained.

By a novel means according to the present invention different from the conventional light-emitting element using a material serving as a ligand, a light-emitting element capable of readily being increased its thickness and operating at low driving voltage can be obtained. Accordingly, a light-emitting element that consumes low power and emits light with good color purity can be obtained. Simultaneously, a light-emitting element that consumes low power and is manufactured in high yields can be obtained.

By using the foregoing light-emitting element for manufacturing a light-emitting device, a light-emitting device that can emit light with good color purity and consumes low power can be manufactured in high yields.

BRIEF DESCRIPTION OF DRAWINGS

FIGS. 9A and 9B are explanatory views of a light-emitting device;

BEST MODE FOR CARRYING OUT THE INVENTION

Hereinafter, a principle of operation and a specific configuration example with respect to embodiments of the present invention are explained in detail.

Figure 1:
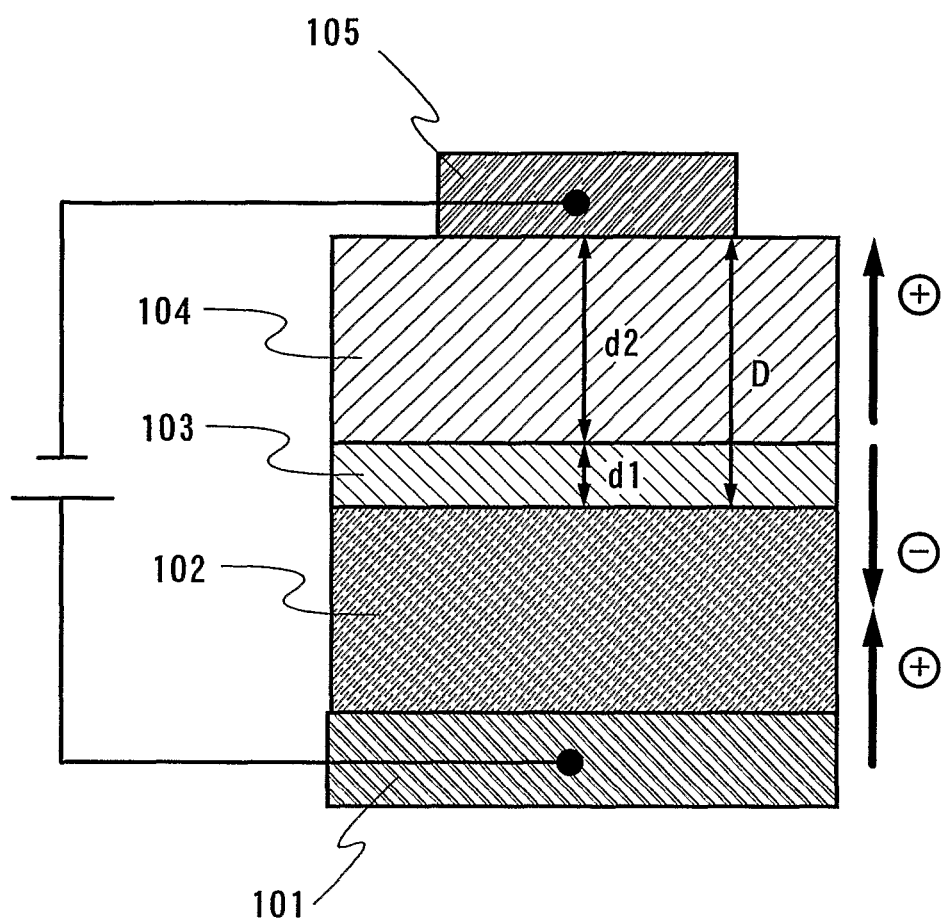
FIG. 1 is an explanatory view of the configuration of a light-emitting element according to the present invention.

A principle of operation of a light-emitting element according to the present invention is explained with reference to FIG. 1. FIG. 1 illustrates a basic configuration of a light-emitting element according to the present invention.

A light-emitting element according to the present invention (FIG. 1) is formed to have a structure in which a first layer 102, a second layer 103, and a third layer 104 are formed sequentially over an anode 101 to be interposed between the anode 101 and a cathode 105. As used herein, the term "anode" refers to an electrode for injecting holes. As used herein, the term "cathode" refers to an electrode for injecting electrons or accepting holes.

The second layer 103 is a layer for producing and transporting electrons. The second layer 103 is made from n-type semiconductor, a mixture containing that, or a mixture of an organic compound having a carrier transporting property and a material having high electron donor property. Also, the third layer 104 is a layer for producing and transporting holes. The third layer 104 is made from p-type semiconductor, a mixture containing that, or a mixture of an organic compound having a carrier transporting property and a material having high electron acceptor property. Further, the first layer 102 is a layer containing a light-emitting material and is formed by a single layer or a plurality of layers.

The first layer 102, the second layer 103, and the third layer 104 are made from selected materials to have selected thicknesses so that an emitting region is formed in the fist layer 102.

Upon applying forward bias to the light-emitting element having the foregoing configuration, electrons and holes are flown out in opposite directions to each other from the vicinity of an interface between the second layer 103 and the third layer 104, respectively as shown in FIG. 1. Among thus produced carriers, electrons are recombined with holes injected from the anode 101 to emit light in the first layer 102. On the other hand, holes are passing through the third layer 104 to reach the cathode 105. In the case of focusing attention on the second layer 103 and the third layer 104, reverse bias is applied to a p-n junction. In addition, an amount of generated carriers is not drastically large but adequate available for operation of the light-emitting element.

Figure 2:
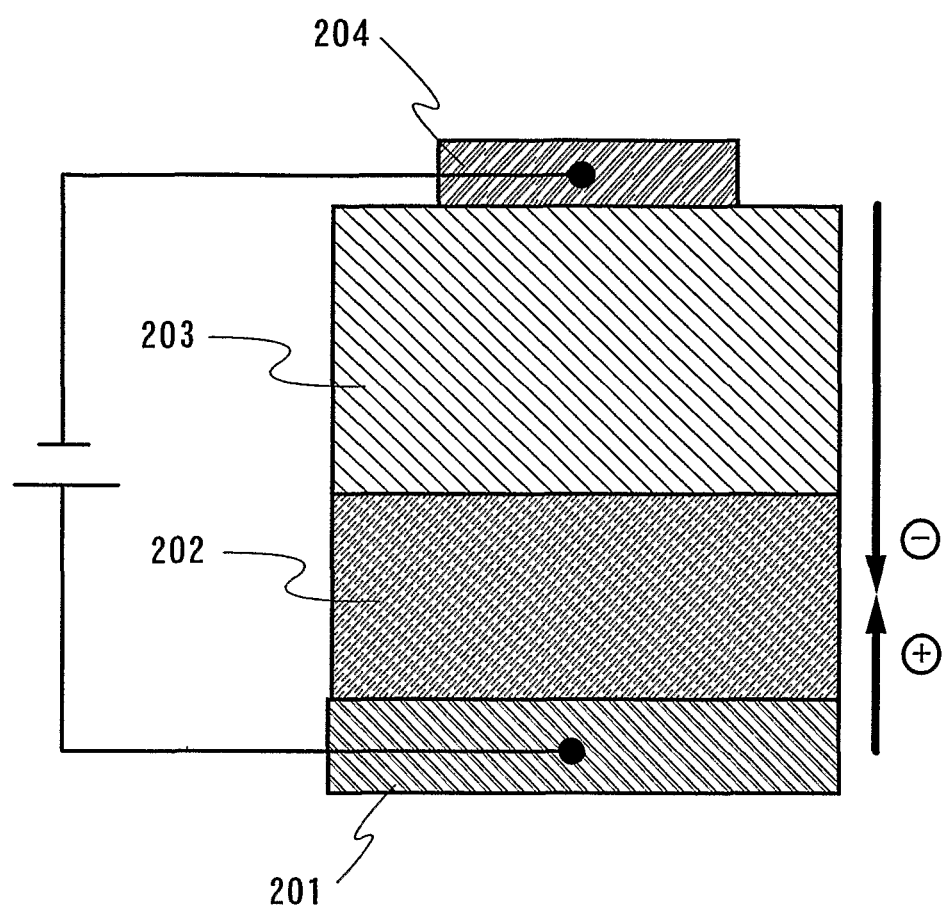
FIG. 2 is an explanatory view of the configuration of a light-emitting element according to the conventional invention.

Such the light-emitting element according to the present invention can control an optical path by increasing the thickness of the third layer that can produce holes and move them. On this point, the light-emitting element according to the present invention is different from the conventional light-emitting element that controls an optical path by increasing the thickness of an electron injecting layer 203 containing BCP, that is, a layer that produces electrons and transports them (FIG. 2).

Hole mobility of an organic compound generally used as a hole transporting material is higher than electron mobility of an organic compound generally used as an electron transporting material. Therefore, it is better to increase the thickness of a layer that can move holes (third layer) to control an optical path for preventing driving voltage from increasing with the increase of the thickness of the third layer.

These and other objects, features and advantages of the present invention will become more apparent upon reading of the following detailed description along with the accompanied drawings. The present invention is to be understood that various changes and modifications will be apparent to those skilled in the art. Therefore, unless otherwise such changes and modifications depart from the scope of the present invention hereinafter described, they should be construed as being included therein.

Embodiment 1

Figure 3A:
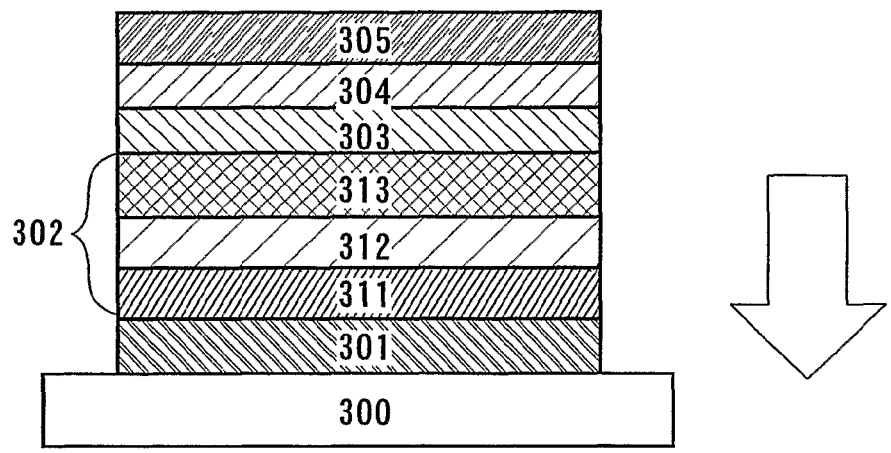
FIGS. 3A to 3C are explanatory views of the configuration of a light-emitting element according to the present invention.
Figure 3B:
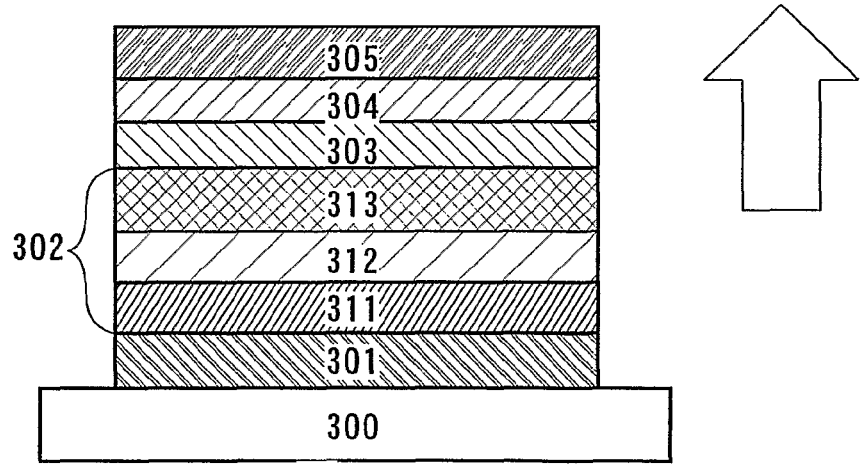
Figure 3C:
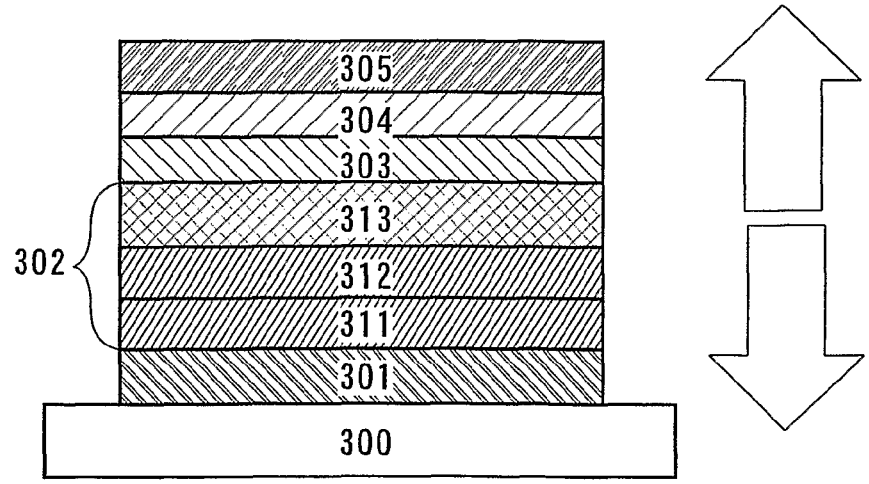

A light-emitting element according to the present invention is explained in Embodiment 1 with reference to FIGS. 3A to 3C.

As illustrated in FIGS. 3A to 3C, a light-emitting element has a configuration composed of an anode 301 formed over a substrate 300, a first layer containing a light-emitting material 302 formed over the anode 301, a second layer 303 formed over the first layer 302, a third layer 304 formed over the second layer 303, and a cathode 305 formed over the third layer 304.

As a material for the substrate 300, any substrate as long as it is used in the conventional light-emitting element can be used. For example, a glass substrate, a quartz substrate, a transparent plastic substrate, or a substrate having flexibility can be used.

As an anode material for forming the anode 301, metal having a large work function (at least 4.0 eV), alloys, compounds having electrical conduction properties, and mixture of these materials are preferably used. As specific examples of the anode materials, aurum (Au), platinum (Pt), nickel (Ni), tungsten (W), chrome (Cr), molybdenum (Mo), ferrum (Fe), cobalt (Co), copper (Cu), palladium (Pd), nitride of metal material (TiN), or the like can be used besides ITO (indium tin oxide), ITO containing silicon, IZO (indium zinc oxide) composed of indium oxide mixed with zinc oxide (ZnO) of from 2 to 20%.

On the other hand, as a cathode material for forming the cathode 305, metal having a small work function (at most 3.8 eV), alloys, compounds having electrical conduction properties, and mixture of these materials can be preferably used. As specific examples of the cathode materials, a transition metal containing a rare earth metal can be used, besides an element in the first or second periodic row, that is, an alkaline metal such as Li, or Cs, alkaline earth metal such as Mg, Ca, or Sr, alloys of these elements (Mg: Ag, Al: Li), or compounds (LiF, CsF, $CaF_2$). Alternatively, the cathode 305 can be formed by a laminated layer including Al, Ag, ITO (including alloys), or the like.

The above anode and cathode materials are respectively deposited by vapor deposition or sputtering to form thin films as the anode 301 and the cathode 305. These films are preferably formed to have thicknesses of from 10 to 500 nm. A protective layer (barrier layer) may be lastly formed by an inorganic Material such as SiN or an organic material such as Teflon or styrene polymer. The barrier layer may be either transparent or opaque. The barrier layer is formed by the foregoing inorganic material or organic material by vapor deposition, sputtering, or the like.

To prevent the organic layer or the electrode of the light-emitting element from being oxidized or getting wet, desiccant such as SrOx or SiOx may be formed by electron beam irradiation, vapor deposition, sputtering, sol-gel, or the like.

A light-emitting element according to the invention has the structure that light generated by recombination of carries within the layer containing a light-emitting material that serves as the first layer is emitted from either the anode 301 or the cathode 305, or both electrodes to outside as illustrated in FIGS. 3A to 3C (arrows in the drawing indicate emission directions). When light emits from the anode 301 (FIG. 3A), the anode 301 is formed by a material having a light transmission property. When light emits from the cathode 305 (FIG. 3B), the cathode 305 is formed by a material having a light transmission property. When light emits from both of the anode 301 and cathode 305 (FIG. 3C), the anode 301 and cathode 305 are formed by materials having a light transmission property.

The first layer 302 is formed by stacking a plurality of layers. In Embodiment 1, the first layer 302 is formed by stacking a fourth layer 311, a fifth layer 312, and a sixth layer 313. The fourth layer 311 is a hole injecting layer containing a hole injecting material. The fifth layer 312 is a hole transporting layer containing a hole transporting material. The sixth layer 313 is a light-emitting layer containing a light-emitting material to be provided with an emitting region upon being applied with an electric field.

A known material can be used for the layer containing a light-emitting material that serves as the first layer. As the known material, either of a low molecular based material or a high molecular based material can be used.

As a hole injecting material for forming the fourth layer 311, a phthalocyanine compound is useful. For example, phthalocyanine (hereinafter, $H_2$-Pc), copper phthalocyanine (hereinafter, Cu-Pc), and the like can be used.

As hole transporting materials for forming the fifth layer 312, an aromatic amine (that is, the one having a benzene ring-nitrogen bond) based compound is preferably used. For example, 4,4'-bis[N-(3-methylphenyl)-N-phenyl-amino]-biphenyl (abbreviated TPD), and derivatives thereof such as 4,4'-bis[N-(1-naphthyl)-N-phenyl-amino]-biphenyl (abbreviated a-NPD) are widely used. Also used are a star burst aromatic amine compound such as 4,4',4''-tris(N,N-diphenyl-amino)-triphenyl amine (abbreviated TDATA), and 4,4',4''-tris[N-(3-methylphenyl)-N-phenyl-amino]-triphenyl amine (abbreviated MTDATA). Alternatively, a conductive inorganic compound such as oxide molybdenum, or a composite material of the conductive inorganic compound and the foregoing organic compound can be used.

As a light-emitting material contained in the sixth layer 313, an organic compound such as quinacridone, coumarin, rubrene, styryl based pigments, tetraphenyl-butadiene, anthracene, perylene, coronene, 12-phthaloperinone derivative can be used. Further, a metal complex such as tris(8-quinolinolate)aluminum (hereinafter, $Alq_3$) can be nominated.

The second layer 303 may be made from n-type semiconductor such as zinc oxide, tin oxide, titanium oxide, zinc sulfide, zinc selenide, or zinc telluride. Alternatively, the second layer 303 may include the foregoing n-type semiconductor. Further alternatively, the second layer 303 may be formed by an organic compound doped with a material having an electron donor property for the organic compound. As the organic compound in this instance, an electron transporting material is preferably used, for example, 2-(4-biphenyl)-5-(4-tert-butylphenyl)-1,3,4-oxadiazole (abbreviated PBD); the foregoing OXD-7, TAZ, p-EtTAZ, BPhen, BCP can be nominated. Besides, a metal complex having a quinoline skeleton or a benzoquinoline skeleton such as $Alq_3$ that leads to increasing of driving voltage conventionally; tris(5-methyl-8-quinolinolate)aluminum (abbreviated $Almq_3$), or bis(10-hydroxybenzo[h]-quinolinato)beryllium (abbreviated $BeBq_2$); or bis(2-methyl-8-quinolinolate)-4-phenylphenolato-aluminum (abbreviated BAlq) can be nominated. On the other hand, as an electron donor material, an alkali metal such as Li or Cs; an alkali earth metal such as Mg, Ca, or Sr; or a rare earth metal such as Er or Yb can be nominated. Besides, an organic compound having electron donor property, for example, for $Alq_3$ such as a tetrathiafulvalene or tetramethylthiafulvalene can be used.

The third layer 304 may be made from p-type semiconductor such as vanadium oxide, chromium oxide, molybdenum oxide, cobalt oxide, or nickel oxide. Alternatively, the third layer 304 may include the foregoing p-type semiconductor. Further alternatively, the third layer 304 may be formed by an organic compound doped with a material having an electron acceptor property for the organic compound. As the organic compound in this instance, a hole transporting material is preferably used. Especially, an aromatic amine based compound is preferably used. For example, in addition to TPD, α-NPD that is a derivative of the TPD, or a star burst aromatic amine compound such as TDATA, MTDATA, and the like can be nominated. On the other hand, as the material having an electron acceptor property, metal oxide such as molybdenum oxide or vanadium oxide that has an electron acceptor property for α-NPD can be nominated. Alternatively, an organic compound having an electron acceptor property for α-NPD such as tetracyanoquinodimethan (abbreviated TCNQ) or 2,3-dicyanonaphtoquinon (DCNNQ) can be used.

Thus, a light-emitting element according to the present invention can be formed. In this embodiment, a layer made from a material having good electron transporting property may be provided to a part of the first layer 302 so as to be in contact with the second layer 303. As the material having good electron transporting property, a metal complex having a quinoline skeleton or a benzoquinoline skeleton such as tris(8-quinolinolate)aluminum (abbreviated $Alq_3$), tris(5-methyl-8-quinolinolate)aluminum (abbreviated $Almq_3$), bis(10-hydroxybenzo[h]-quinolinato)beryllium (abbreviated $BeBq_2$), or bis(2-methyl-8-quinolinolate)-4-phenylphenolato-aluminum (abbreviated BAlq) is preferably used. Alternatively, a metal complex having an oxazole based or thiazole based ligand such as bis [2-(2-hydroxyphenyl)-benzooxazolate]zinc (abbreviated $Zn(BOX)_2$), or bis [2-(2-hydroxyphenyl)-benzothiazolate]zinc (abbreviated $Zn(BTZ)_2$) can be used. In addition to the metal complex, 2-(4-biphenyl)-5-(4-tert-butylphenyl)-1,3,4-oxadiazole (abbreviated PBD); 1,3-bis[5-(p-tert-butylphenyl)-1,3,4-oxadiazole-2-yl]benzene (abbreviated OXD-7); 3-(4-tert-butylphenyl)-4-phenyl-5-(4-biphenylyl)-1,2,4-triazole (abbreviated TAZ); 3-(4-tert-butylphenyl)-4-(4-ethylphenyl)-5-(4-biphenylyl)-1,2,4- triazole (abbreviated p-EtTAZ); bathophenanthroline (abbreviated BPhen); bathocuproin (abbreviated BCP); or the like can be used.

In the foregoing light-emitting element according to the present invention, light can be emitted from the cathode as shown in FIG. 3B in the case of forming the cathode by a conductive material that is transparent to visible light. Alternatively, light can be emitted from the anode as shown in FIG. 3A in the case of forming the anode by a conductive material that is transparent to visible light. Further alternatively, light can be emitted from the cathode and anode as shown in FIG. 3C in the case of forming the cathode and anode by a conductive material that is transparent to visible light.

As a conductive material that is transparent to visible light and has a comparative high conductive property, the above-mentioned ITO, IZO, and the like can be nominated. The foregoing materials are generally unsuitable for forming a cathode.

Since the light-emitting element according to the present invention has the structure in which a layer for producing holes and transporting them and a layer for producing electrons and transporting them are provided, driving voltage is not increased even if a material having a high work function such as ITO or IZO is used. Therefore, ITO or IZO can be used as a material for forming the cathode in the light-emitting element according to the present invention.

Despite of using sputtering for forming the cathode in the light-emitting element according to the present invention, a light-emitting element having good characteristics and being suffered from little damage due to the sputtering can be obtained. Therefore, a cathode can be formed by using a conductive material that is transparent to light such as ITO that is mainly formed by sputtering.

Embodiment 2

A configuration of a light-emitting element according to the present invention is explained with reference to FIGS. 4A to 4C in Embodiment 2.

A substrate 400, an anode 401, a first layer 402, a second layer 403, a third layer 404, and a cathode 405 can be formed by the same materials and the same processes explained in Embodiment 1, and are explained in no more details.

Figure 4A:
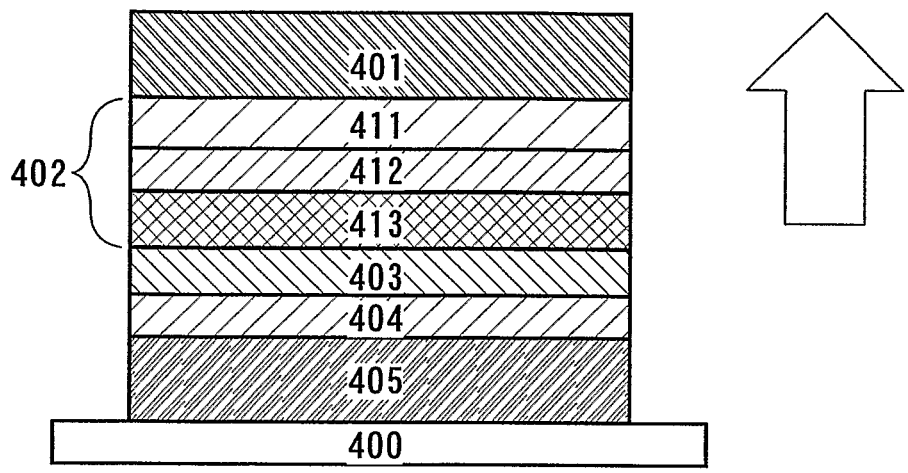
FIGS. 4A to 4C are explanatory views of the configuration of a light-emitting element according to the present invention.
Figure 4B:
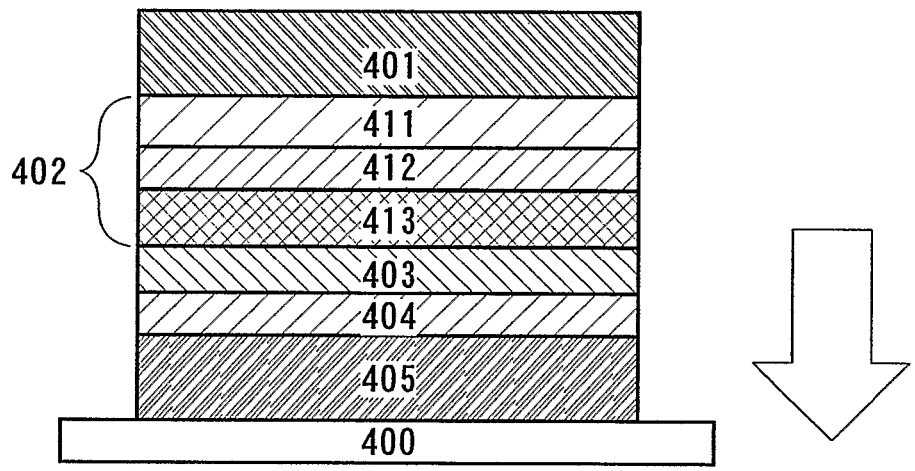
Figure 4C:
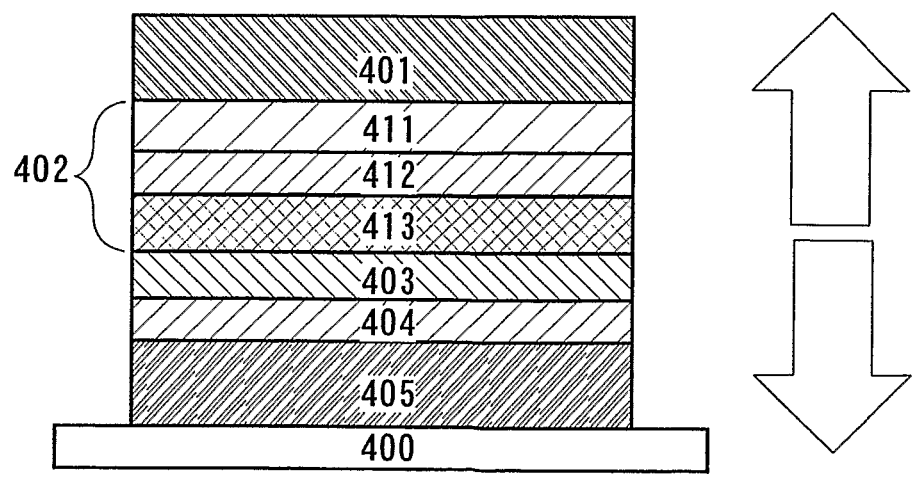

As illustrated in FIGS. 4A to 4C, a light-emitting element has a configuration composed of a cathode 405 formed over the substrate 400, the third layer 404 formed over the cathode 405, the second layer 403 formed over the third layer 404, the first layer 402 containing a light-emitting material formed over the second layer 403, and the anode 401 formed over the first layer 402.

A light-emitting element according to the invention has the structure that light generated by recombination of carries within the first layer containing the light-emitting material is emitted from either the anode 401 or the cathode 405, or both electrodes to outside as illustrated in FIGS. 4A to 4C. When light emits from the anode 401 (FIG. 4A), the anode 401 is formed by a material having a light transmission property. When light emits from the cathode 405 (FIG. 4B), the cathode 405 is formed by a material having a light transmission property. When light emits from both of the anode 401 and cathode 405 (FIG. 4C), the anode 401 and cathode 405 are formed by materials having a light transmission property.

Thus, the light-emitting element according to the present invention can be manufactured.

In the foregoing light-emitting element according to the present invention, light can be emitted from the anode as shown in FIG. 4A in the case of forming the anode by a conductive material that is transparent to visible light. Alternatively, light can be emitted from the cathode as shown in FIG. 4B in the case of forming the cathode by a conductive material that is transparent to visible light. Further alternatively, light can be emitted from the cathode and anode as shown in FIG. 4C in the case of forming the cathode and anode by a conductive material that is transparent to visible light.

As described in Embodiment 2, as a conductive material that is transparent to light and has a comparative high conductive property, the above-mentioned ITO, IZO, and the like can be nominated. The foregoing materials are generally unsuitable for forming a cathode since they have a high work function.

Since the light-emitting element according to the present invention has the structure in which a layer for producing holes and transporting them and a layer for producing electrons and transporting them are provided, driving voltage is not increased even if a material having a high work function such as ITO or IZO is used. Therefore, ITO or IZO can be used as a material for forming the cathode in the light-emitting element according to the present invention.

Embodiment 3

Figure 5:
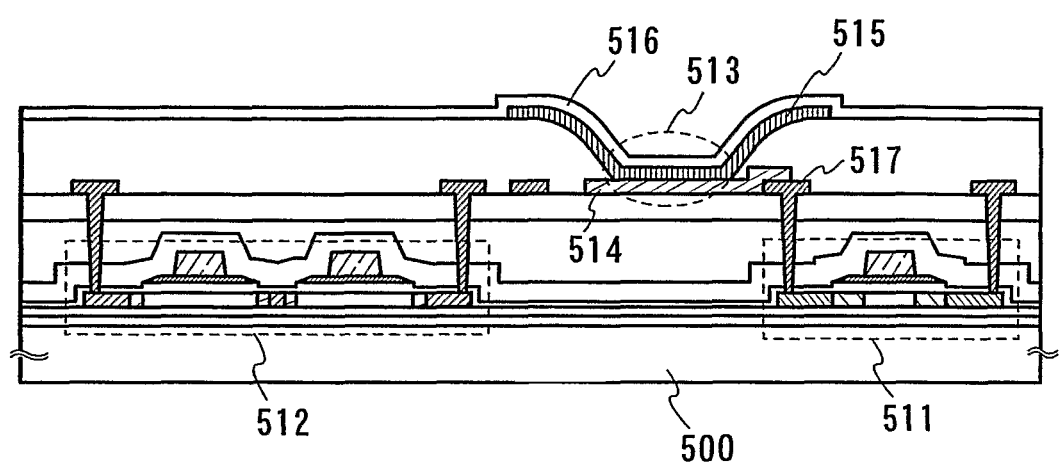
FIG. 5 is an explanatory view of a light-emitting device.

In this embodiment, a light-emitting element is manufactured over a substrate 500 such as a glass, quartz, metal, bulk semiconductor, transparent plastic, or flexible substrate. A passive light-emitting device can be manufactured by a plurality of such the light-emitting elements over one substrate. A light-emitting element may be manufactured to be in contact with a thin film transistor (TFT) array as shown in FIG. 5 instead of manufacturing the light-emitting element over the substrate such as a glass, quartz, transparent plastic, or flexible substrate. Here, reference numeral 511 denotes a TFT; 512, a TFT; and 513, a light-emitting element according to the present invention. The light-emitting element 513 is composed of an anode 514, first, second, and third layers 515, and a cathode 516; and is connected electrically to the TFT 511 via a wiring 517. Thus, an active matrix light-emitting device that controls driving of a light-emitting element by a TFT can be manufactured. Further, the structure of the TFT is not especially limited. For example, either a staggered TFT or a reverse staggered TFT may be used. In addition, the crystallinity of a semiconductor layer composing the TFT is not especially limited. Either a crystalline or an amorphous semiconductor layer may be used.

EXAMPLE 1

Figure 6:
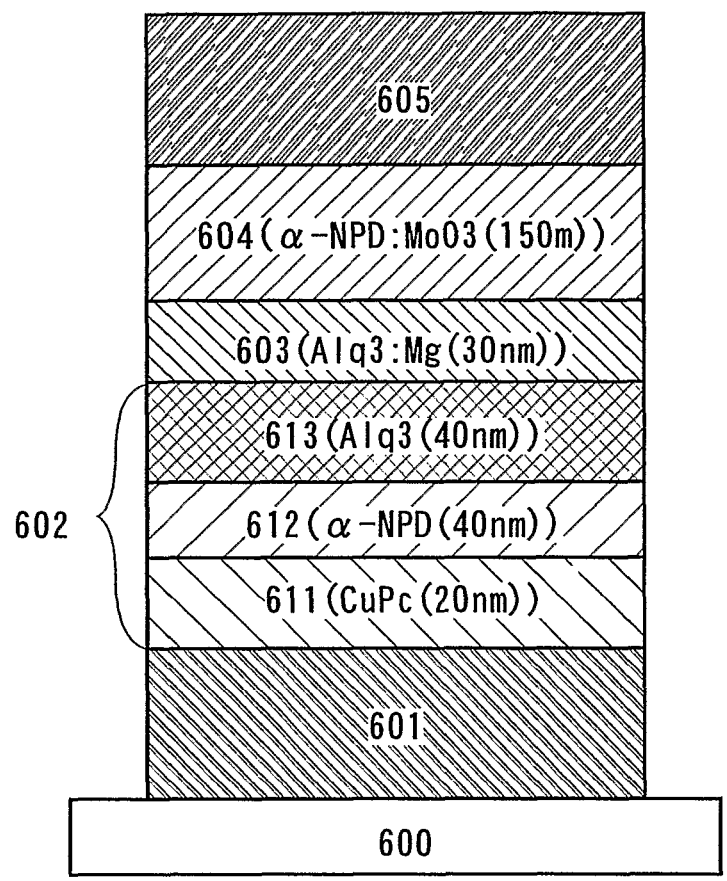
FIG. 6 is an explanatory view of the configuration of a light-emitting element according to the present invention.

One mode of a light-emitting element according to the present invention is specifically exemplified in this example. A configuration of the light-emitting element is explained with reference to FIG. 6.

An anode 601 of the light-emitting element was formed over a substrate 600. The anode 601 was made from an ITO that is a transparent conductive film by sputtering to have a thickness of 110 nm and a size of 2×2 mm.

Then, a first layer containing a light-emitting material 602 was formed over the anode 601. The first layer containing a light-emitting material 602 according to this example was formed to have a layered structure composed of three layers, that is, a hole injecting layer 611, a hole transporting layer 612, and a light-emitting layer 613.

A substrate provided with the anode 601 was secured with a substrate holder of a vacuum deposition system in such a way that the surface provided with the anode 601 was down.

Then, copper phthalocyanine (hereinafter, Cu-Pc) was put into an evaporation source installed in the internal of the vacuum deposition system. And then, the hole injecting layer 611 was formed to have a thickness of 20 nm by vapor deposition with a resistive heating method. As a material for the hole injecting layer 611, a known hole injecting material can be used.

The hole transporting layer 612 was made from a material having a good hole transporting property. As a material for the hole transporting layer 612, a known hole transporting material can be used. In this example, α-NPD was used to have a thickness of 40 nm by the same process as that for forming the hole injecting layer 611.

And then, the light-emitting layer 613 was formed. As a material for forming the light-emitting layer 613, a known light-emitting material can be used. In this example, $Alq_3$ was used to have a thickness of 40 nm by the same process as that for forming the hole transporting layer 612. Here, the $Alq_3$ serves as a light-emitting material.

A second layer 603 was formed after forming these three layers of the hole injecting layer 611, the hole transporting layer 612, and the light-emitting layer 613. The second layer 603 was made from $Alq_3$ as an electron transporting material and Mg as an electron donor material for the $Alq_3$ to have a thickness of 30 nm by co-evaporation in this example. The Mg of 1 wt % was present in the material for the second layer 603.

A third layer 604 was formed. The third layer 604 was made from α-NPD as a hole transporting material and molybdenum oxide as an electron acceptor material for the α-NPD to have a thickness of 150 nm by co-evaporation in this example. The molybdenum oxide of 25 wt % was present in the material for the third layer 604. As a raw material for the molybdenum oxide, molybdenum oxide (VI) was used.

A cathode 605 was formed by sputtering or vapor deposition. The cathode 605 was obtained by forming aluminum (150 nm) by vapor deposition over the third layer 604.

Figure 11:
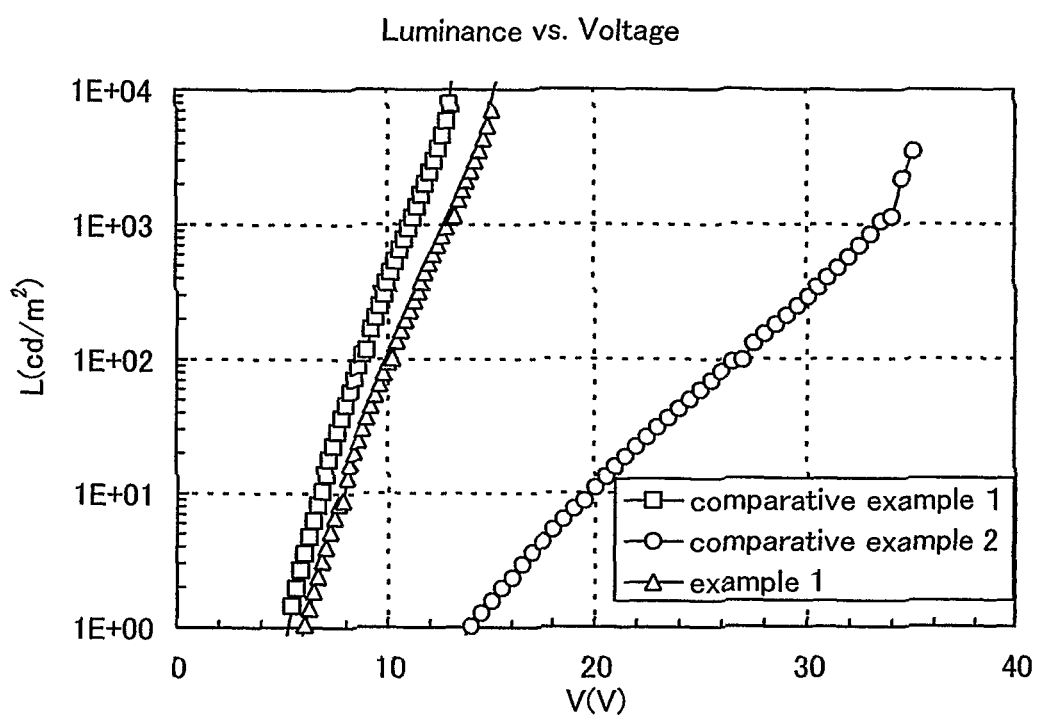
FIG. 11 is a view for showing voltage-luminance characteristics of a light-emitting element.
Figure 12:
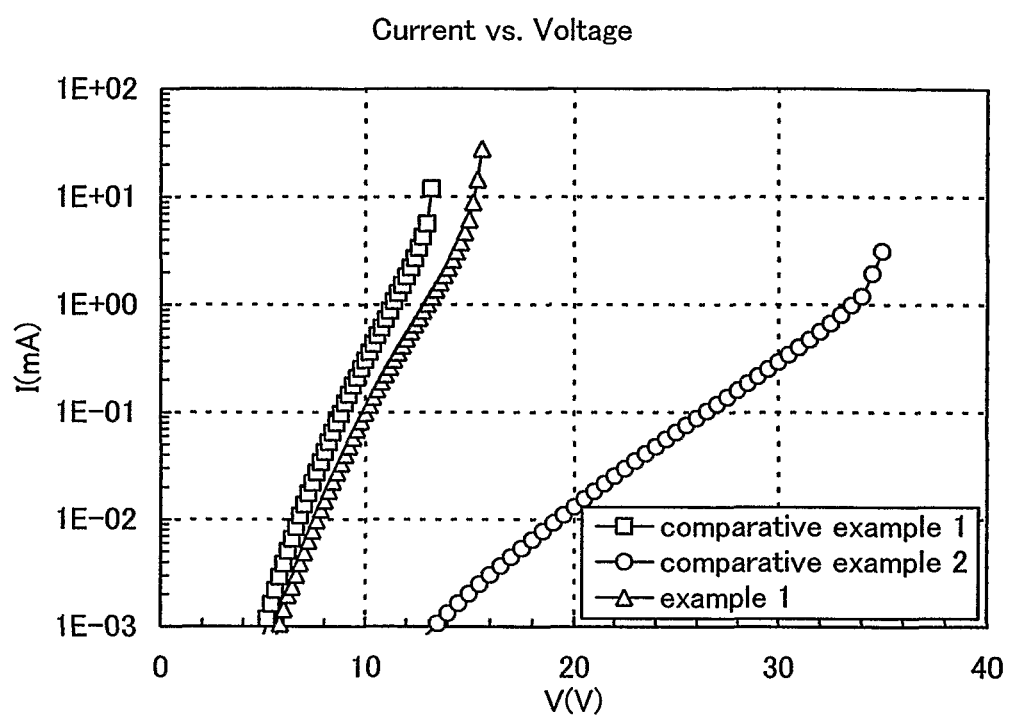
FIG. 12 is a view for showing current-voltage characteristics of a light-emitting element.
Figure 13:
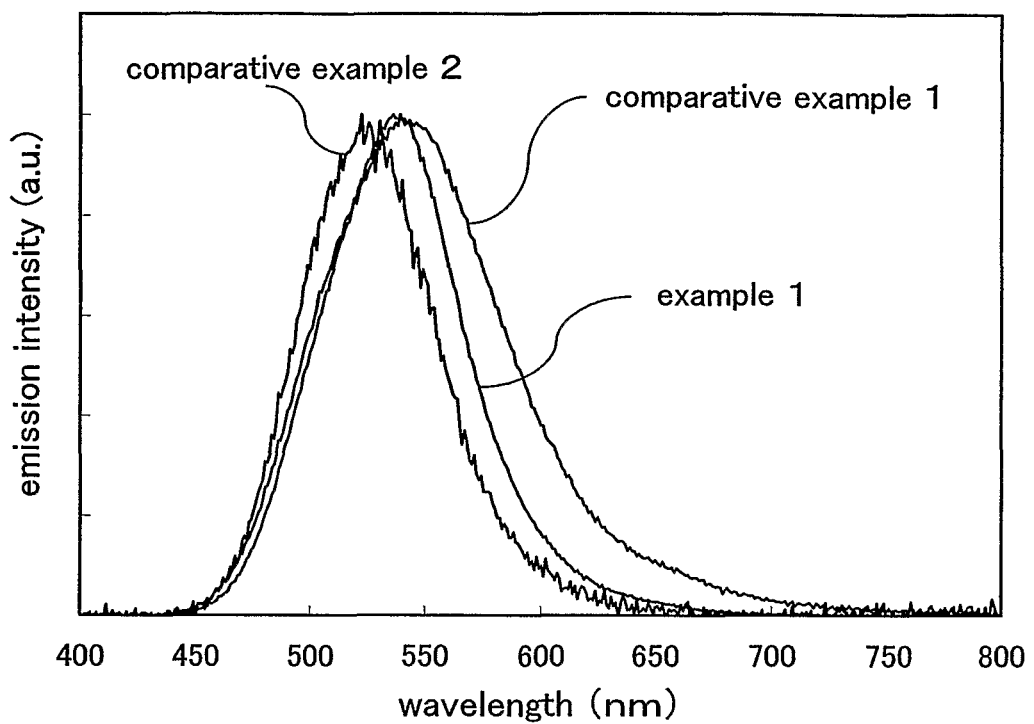
FIG. 13 is a view for showing emission spectra of a light-emitting element.

Thus, the light-emitting element according to the present invention was obtained. FIG. 11 illustrates luminance-voltage characteristics of the obtained light-emitting element. FIG. 12 illustrates current-voltage characteristics of the obtained light-emitting element. FIG. 13 illustrates an emission spectrum of the obtained light-emitting element at applied current of 1 mA.

Onset voltage (a voltage for luminance of at least 1 $cd/m^2$) was 6.0 V upon applying voltage to the obtained light-emitting element. The luminance of 1130 $cd/m^2$ was obtained at applied current of 1 mA. The light-emitting element achieved green emission with good color purity with the CIE chromaticity coordinates x=0.29, y=0.63.

Comparative Example 1

Figure 7:
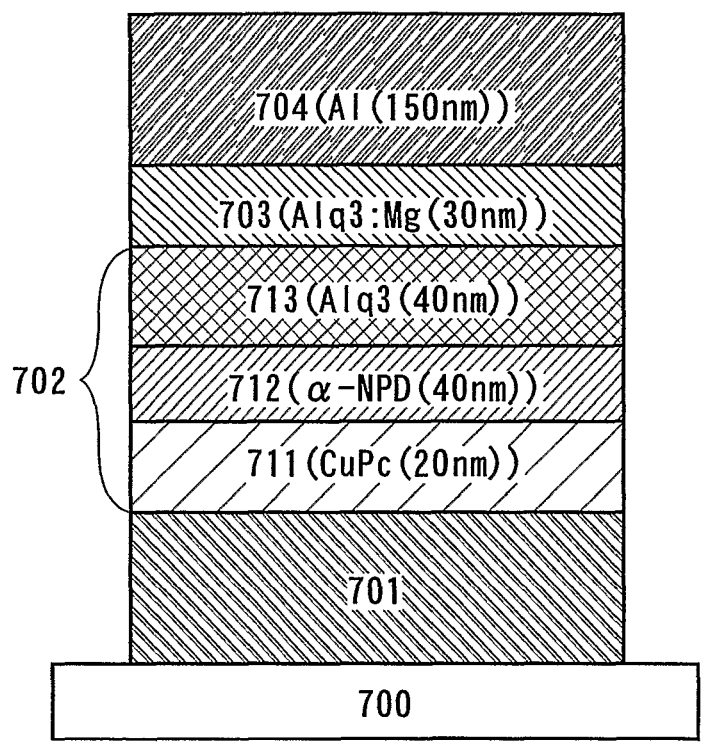
FIG. 7 is an explanatory view of the configuration of a light-emitting element of a comparative example to a light-emitting element according to the present invention.

The conventional light-emitting element provided with an electron injecting layer 703 instead of the foregoing second and third layers according to the present invention is specifically explained in this comparative example 1. The configuration of the light-emitting element is explained with reference to FIG. 7. The electron injecting layer 703 was, as is the case with the second layer 603 in Example 1, made from an electron transporting material $Alq_3$ doped with 1 wt % of Mg that is a material having an electron donor property for the $Alq_3$. The electron injecting layer 703 was formed to have a thickness of 30 nm as is the case with the second layer 603 in Example 1. A substrate 700; an anode 701; a layer containing a light-emitting material 702 composed of a hole injecting layer 711, a hole transporting layer 712, and a light-emitting layer 713; and a cathode 704 were formed to have the same structures as those in Example 1. Therefore, the light-emitting element according to Example 1 is thicker by the thickness of the third layer 604 (150 nm) than that according to Comparative Example 1.

FIG. 11 illustrates luminance-voltage characteristics of the obtained light-emitting element. FIG. 12 illustrates current-voltage characteristics of the obtained light-emitting element. FIG. 13 illustrates an emission spectrum of the obtained light-emitting element at applied current of 1 mA. Onset voltage was 5.4 V upon applying voltage to the obtained light-emitting element. The luminance of 1360 $cd/m^2$ was obtained at applied current of 1 mA. The light-emitting element achieved yellow green emission with not good color purity with the CIE chromaticity coordinates x=0.34, y=0.58.

The above mentioned results show that the driving voltage (6.0 V) of the light-emitting element according to Example 1 was almost the same as that (5.4 V) of the light-emitting element according to Comparative Example 1, although a total thickness of the light-emitting element according to Example 1 is thicker by 150 nm than that according to Comparative Example 1. Further, compared with the emission spectra with each other in FIG. 13, an emission spectrum according to Example 1 has a narrower spectrum than that of the emission spectrum according to Comparative Example 1. Accordingly, it can be considered that the narrow emission spectrum leads to the improvement of color purity of the light-emitting element according to Example 1.

Comparative Example 2

Figure 8:
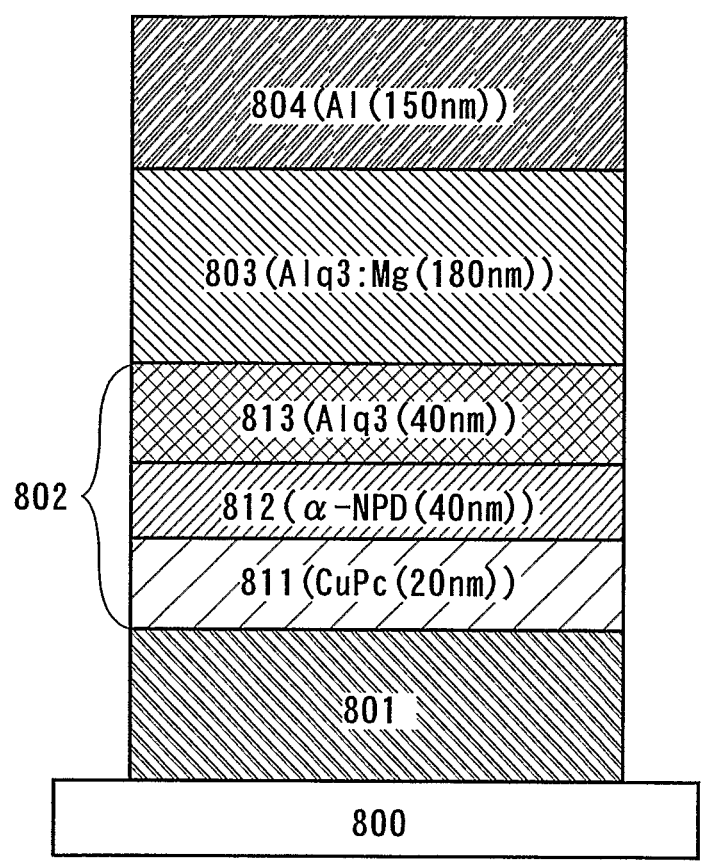
FIG. 8 is an explanatory view of the configuration of a light-emitting element of a comparative example to a light-emitting element according to the present invention.

The conventional light-emitting element provided with a substrate 800; an anode 801; a layer containing a light-emitting material 802 composed of a hole injecting layer 811, a hole transporting layer 812, and a light-emitting layer 813; a cathode 804; each of which has the same structure as that according to Example 1; and an electron injecting layer 803 is specifically explained in this comparative example 2. The configuration of the light-emitting element is explained with reference to FIG. 8. The electron injecting layer 803 has the same structure as that according to Comparative Example 1. The electron injecting layer 803 was formed to have a thickness of 180 nm so that the light-emitting element has the same total thickness of as that according to Example 1.

FIG. 11 illustrates luminance-voltage characteristics of the obtained light-emitting element. FIG. 12 illustrates current-voltage characteristics of the obtained light-emitting element. FIG. 13 illustrates an emission spectrum of the obtained light-emitting element applied with current of 1 mA. Onset voltage was 14.0 V upon applying voltage to the obtained light-emitting element. The luminance of 1050 $cd/m^2$ was obtained at applied current of 1 mA. The light-emitting element achieved green emission with good color purity with the CIE chromaticity coordinates x=0.25, y=0.63.

Above mentioned results show that the driving voltage of the light-emitting element according to Comparative Example 2 was drastically increased than that of the light-emitting element having the same thickness according to Example 1 of the present invention although the light-emitting element according to Comparative Example 2 has a narrow emission spectrum as shown in FIG. 13 with good color purity.

Therefore, the practice of one embodiment of the present invention in which a first layer 602, a second layer 603, and a third layer 604 are sequentially provided between a pair of electrodes (anode 601 and cathode 605) is enable a light-emitting element to improve color purity by increasing the total thickness of the layers, simultaneously, driving voltage to be prevented from being increased despite of increasing the total thickness of the layers.

EXAMPLE 2

Figure 14:
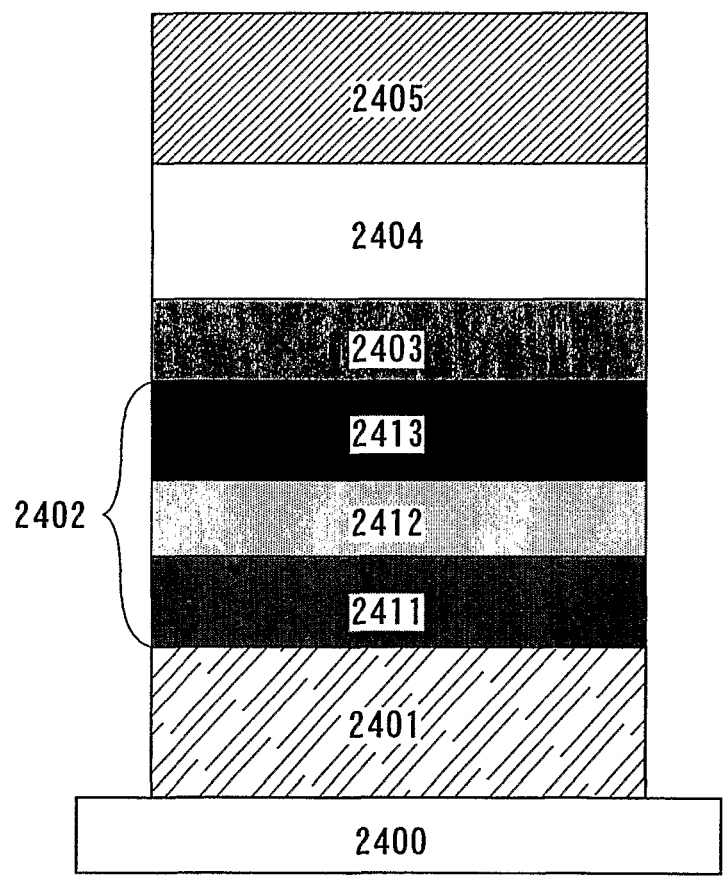
FIG. 14 is an explanatory view of the configuration of a light-emitting element according to the present invention.

One embodiment of a light-emitting element according to the present invention is specifically exemplified in this example 2. The configuration of the light-emitting element is explained with reference to FIG. 14.

An anode 2401 of the light-emitting element is formed over a substrate 2400. The anode 2401 was made from an ITO that is a transparent conductive film by sputtering to have a thickness of 110 nm and a size of 2×2 mm.

Then, a first layer containing a light-emitting material 2402 was formed over the anode 2401. The first layer containing a light-emitting material 2402 according to this example is formed to have a layered structure composed of three layers, that is, a hole injecting layer 2411, a hole transporting layer 2412, and a light-emitting layer 2413.

A substrate provided with the anode 2401 was secured with a substrate holder of a vacuum deposition system in such a way that the surface provided with the anode 2401 was down. Then, Cu-Pc was put into an evaporation source installed in the internal of the vacuum deposition system. And then, the hole injecting layer 2411 was formed to have a thickness of 20 nm by vapor deposition with a resistive heating method. As a material for the hole injecting layer 2411, a known hole injecting material can be used.

The hole transporting layer 2412 was made from a material having a good hole transporting property. As a material for the hole transporting layer 2412, a known hole transporting material can be used. In this example, α-NPD was used to have a thickness of 40 nm by the same process as that for forming the hole injecting layer 2411.

A light-emitting layer 2413 was formed. As a material for the light-emitting layer 2413, a known light-emitting material can be used. The light-emitting layer 2413 was formed by co-evaporation of $Alq_3$ and coumarin 6 to have a thickness of 40 nm in this example. Here, the coumarin 6 serves as a light-emitting material. The $Alq_3$ and the coumarin 6 were co-evaporated to have a mass ratio of 1:0.003, respectively.

A second layer 2403 was formed after forming the three layers of the hole injecting layer 2411, the hole transporting layer 2412, and the light-emitting layer 2413. The second layer 2403 was made from $Alq_3$ as an electron transporting material and Li as a material having an electron donor property for the $Alq_3$ to have a thickness of 30 nm by co-evaporation in this example. The Li of 1 wt % was present in the material for the second layer 2403.

A third layer 2404 was formed. The third layer 2404 was made from α-NPD as a hole transporting material and molybdenum oxide as a material having an electron acceptor property for the α-NPD to have a thickness of 180 nm by co-evaporation in this example. The molybdenum oxide of 25 wt % was present in the material for the third layer 2404. As a raw material for the molybdenum oxide, molybdenum oxide (VI) was used.

A cathode 2405 was formed by sputtering or vapor deposition. The cathode 2405 was obtained by forming aluminum (200 nm) by vapor deposition over the third layer 2404.

Figure 16:
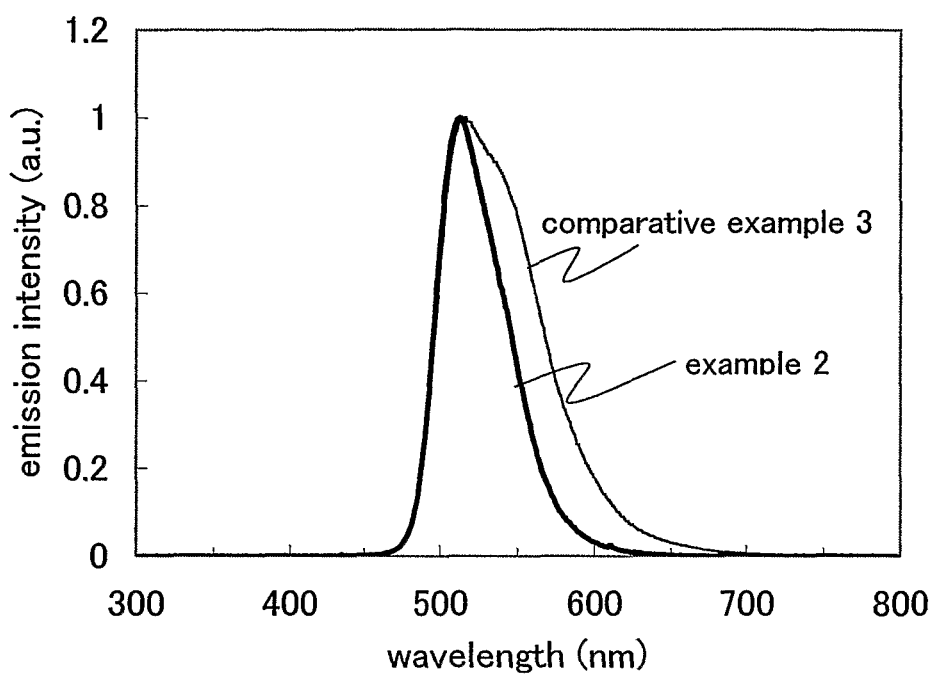
FIG. 16 is a view for showing emission spectra of a light-emitting element.

Onset voltage (a voltage for luminance of at least 1 cd/m$^2$) was 3.4 V upon applying voltage to the obtained light-emitting element. The luminance of 2700 cd/m$^2$ was obtained at applied current of 1 mA. As illustrated in FIG. 16, an emission spectrum shows a sharp line. The light-emitting element achieved green emission with excellent color purity with the CIE chromaticity coordinates x=0.21, y=0.69.

Comparative Example 3

Figure 15:
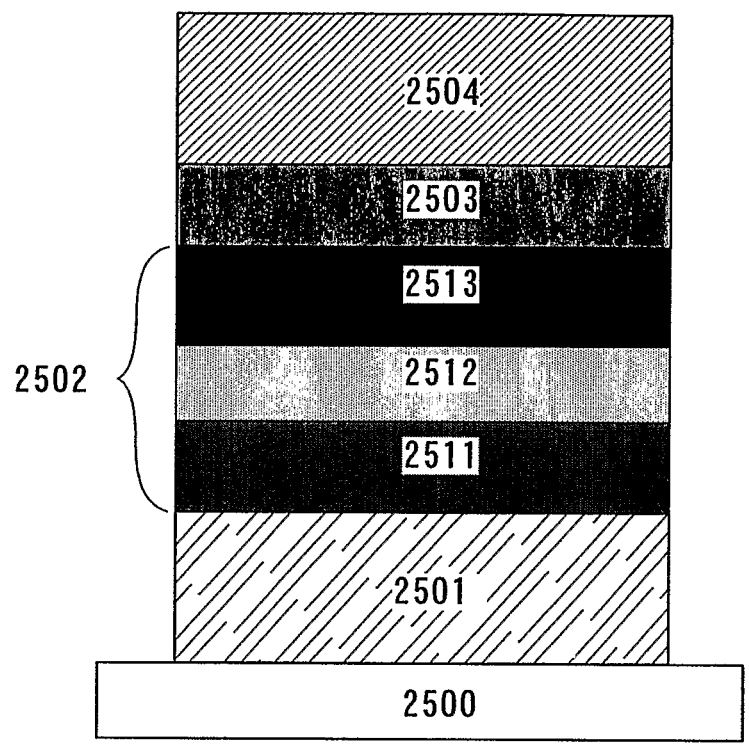
FIG. 15 is an explanatory view of the configuration of a light-emitting element of a comparative example to a light-emitting element according to the present invention.

In this comparative example 3, the conventional light-emitting element provided with an electron injecting layer 2503 instead of the foregoing second and third layers according to the present invention is specifically explained by using FIG. 15. The electron injecting layer 2503 was made from an electron transporting material $Alq_3$ doped with 1 wt % of Li that is a material having an electron donor property for the $Alq_3$ as is the case with the second layer 2503 in Example 2. The electron injecting layer 2503 was formed to have a thickness of 30 nm as is the case with the second layer in Example 2. A substrate 2500; an anode 2501; a layer containing a light-emitting material 2502 composed of a hole injecting layer 2511, a hole transporting layer 2512, and a light-emitting layer 2513; and a cathode 2504 were formed to have the same structures as those in Example 2. Therefore, the light-emitting element according to Example 2 is thicker by the thickness of the third layer 2404 (180 nm) than that according to Comparative Example 3.

Onset voltage was 3.2 V upon applying voltage to the obtained light-emitting element according to Comparative Example 3. The luminance of 3300 cd/m$^2$ was obtained at applied current of 1 mA. As illustrated in FIG. 16, an emission spectrum shows a broad line. The light-emitting element achieved green emission with not good color purity with the CIE chromaticity coordinates x=0.30, y=0.64.

The above mentioned results show that the light-emitting element according to Example 2 has almost the same driving voltage (3.4 V) as that (3.2 V) of the light-emitting element according to Comparative Example 3, although a total thickness of the light-emitting element according to Example 2 is thicker by 180 nm than that according to Comparative Example 3. Further, compared with the emission spectra with each other in FIG. 16, an emission spectrum according to Example 2 has a narrower spectrum than that of emission spectrum according to Comparative Example 3. Accordingly, the narrow spectrum leads to the improvement of color purity of the light-emitting element according to Example 2.

EXAMPLE 3

One embodiment of a light-emitting element according to the present invention is exemplified in Example 3. The configuration of the light-emitting element is explained with reference to FIG. 14. In Example 3, layers except a third layer 2404 in the light-emitting element were formed in accordance with the same method conducted in Example 2. Further, the third layer 2404 was made from molybdenum oxide by vapor deposition to have a thickness of 260 nm. As a raw material for the molybdenum oxide, molybdenum oxide (VI) was used.

Figure 17:
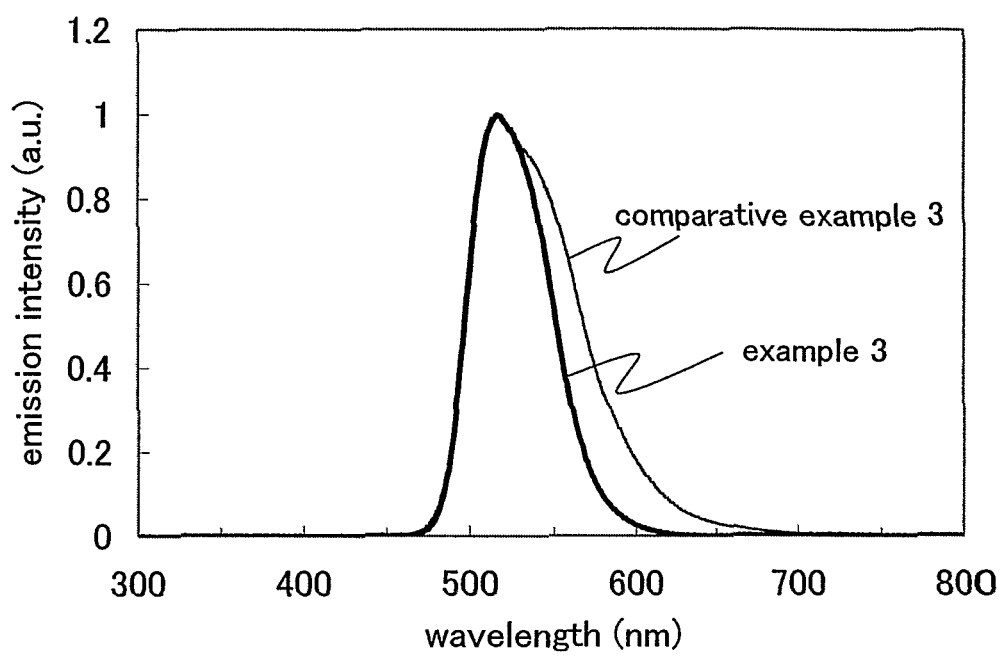
FIG. 17 is a view for showing emission spectra of a light-emitting element.

Onset voltage (a voltage for luminance of at least 1 cd/m$^2$) was 4.6 V upon applying voltage to the obtained light-emitting element. The luminance of 2800 cd/m$^2$ was obtained at applied current of 1 mA. As illustrated in FIG. 17, an emission spectrum shows a sharp line. The light-emitting element achieved green emission with excellent color purity with the CIE chromaticity coordinates x=0.23, y=0.71. For comparison, the above-mentioned emission spectrum of Comparative Example 3 is illustrated in FIG. 17.

The above mentioned results show that the driving voltage (4.6 V) of the light-emitting element according to Example 3 is not increased drastically compared as that (3.2 V) of the light-emitting element according to Comparative Example 3, although a total thickness of the light-emitting element according to Example 3 is thicker by 260 nm than that according to Comparative Example 3. Further, compared with the emission spectra with each other in FIG. 17, an emission spectrum according to Example 3 has a narrower spectrum than that of emission spectrum according to Comparative Example 3. Accordingly, the narrow spectrum leads to the improvement of color purity of the light-emitting element according to Example 3.

EXAMPLE 4

In this example, a light-emitting device having a light-emitting element according to the present invention in a pixel portion will be explained with reference to FIGS. 9A and 9B. FIG. 9A is a top view of a light-emitting device. FIG. 9B is a cross-sectional view of FIG. 9A taken along line A-A'. Reference numeral 901 indicated by dotted line denotes a driver circuit unit (a source side driver circuit); reference numeral 902 denotes a pixel portion; 903, a driver circuit unit (a gate side driver circuit); 904, a sealing substrate; and 905, sealing agent. The inside surrounded by the sealing agent 905 is space 907.

Reference 908 denotes a wiring for transmitting signals to be inputted to the source side driver circuit 901 and the gate side driver circuit 903. The wiring receives video signals, clock signals, start signals, or reset signals from an FPC (flexible printed circuit) 909 serving as an external input terminal. Although only the FPC is illustrated in the drawing, a PWB (printed wirings board) may be attached to the FPC. As used in this specification, the term "light-emitting device" refers to not only a main body of a light-emitting device but also the main body provided with the FPC 909 or PWB.

Then, a cross-sectional structure will be explained with reference to FIG. 9B. A driver circuit and a pixel portion are formed over a substrate 910. In FIG. 9B, the source side driver circuit 901 and the pixel portion 902 are illustrated as a driver-circuit unit.

The source side driver circuit 901 is provided with a CMOS circuit formed by combining an n-channel TFT 923 and a p-channel TFT 924. A TFT for forming a driver circuit may be formed by a known CMOS, PMOS, or NMOS circuit. In this example, a driver integrated type in which a driver circuit is formed over a substrate is described, but not exclusively, the driver circuit can be formed outside instead of over a substrate.

The pixel portion 902 is composed of a plurality of pixels including a switching TFT 911, a current control TFT 912, and an anode 913 connected electrically to the drain of the current control TFT 912. Further, an insulator 914 is formed to cover the edge of the anode 913. Here, the insulator 914 is formed by a positive type photosensitive acrylic resin film.

In order to make favorable coverage, an upper edge portion and a lower edge portion of the insulator 914 are formed to have curved faces having radius of curvatures. For example, in the case that positive type photosensitive acrylic is used as a material for the insulator 914, only upper edge portion of the insulator 914 is preferably having a radius of curvature (from 0.2 to 3 μm). As the insulator 914, either a negative type photosensitive resin that becomes insoluble to etchant by light or a positive type photosensitive resin that becomes dissoluble to etchant by light can be used. For example, not only organic compounds but also inorganic compounds such as silicon oxide, silicon oxynitride, or siloxane can be used.

First to third layers 916, and a cathode 917 are formed over the anode 913, respectively. As a material for the anode 913, a material having a large work function is preferably used. For instance, the anode 913 can be formed by a single layer such as an ITO (indium tin oxide) film, ITSO (indium tin silicon oxide), an IZO (indium zinc oxide) film, a titanium nitride film, a chromic film, a tungsten film, a Zn film, or a Pt film; a laminated layer comprising one of the above single layer and a film containing titanium nitride and aluminum as its main components; a three laminated layer comprising one of the above single layer, a film containing titanium nitride and aluminum as its main components, and a titanium nitride film; or the like. In the case that the anode 913 is formed to have a layered structure, the anode can be formed to have a low resistance as a wiring, and make good ohmic contact, and serve as an anode.

The first to third layers 916 are formed by vapor deposition using an evaporation mask or ink jetting. The first to third layers 916 comprise a first layer containing a light-emitting material, a second layer containing n-type semiconductor, and a third layer containing p-type semiconductor. The first, second, and third layers are formed sequentially over the anode to be interposed between the anode and a cathode in such a way that the third layer is in contact with the cathode. In addition, as a material for a layer containing a light-emitting material, an organic compound in a single layer, a laminated layer, or a mixed layer is generally used. However, the invention comprehends the case that a film made from an organic compound including partly an inorganic compound.

As a material for the cathode 917 formed over the first to third layers 916, a material having a small work function (Al, Ag, Li, Ca, or alloys of these elements such as MgAg, MgIn, AlLi, $CaF_2$, or CaN) can be used. In the case that light generated in the first to third layers 916 passes through the cathode 917, the cathode 917 is preferably formed to have a layered structure comprising a thin metal film and a transparent conductive ITO (indium tin oxide alloys, ITSO (indium tin silicon oxide), $In_2O_3$—ZnO (indium zinc oxide), ZnO (zinc oxide), or the like).

The sealing substrate 904 is pasted onto the substrate 910 with the sealing agent 905 to encapsulate a light-emitting element 918 within the space 907 surrounded by the substrate 910, the sealing substrate 904, and the sealing agent 905. The invention comprehends not only the case that the space 907 is filled with inert gases (such as nitrogen or argon) but also the case that the space 907 is filled with the sealing agent 905.

Epoxy-based resin is preferably used as the sealing agent 905. In addition, it is desirable that the material for the sealing agent inhibits the penetration of moisture or oxygen. As a material for the sealing substrate 904, a plastic substrate such as FRP (fiberglass-reinforced plastics), PVF (poly(vinyl fluoride), Myler, polyester, or acrylic can be used besides a glass substrate or a quartz substrate.

Accordingly, a light-emitting device having a light-emitting element according to the invention can be obtained.

The light-emitting device described in this example can be practiced by combining freely with the configuration of the light-emitting element explained in Examples 1 to 3. The light-emitting device according to this example may be provided with a chromatic conversion film such as a color filter as needed.

EXAMPLE 5

Various electric appliances completed by using a light-emitting device having a light-emitting element according to the present invention will be explained in this example with reference to FIGS. 10A to 10C.

Given as examples of such electric appliances manufactured by using a light-emitting device according to the invention: a television, a camera such as a video camera or a digital camera, a goggles-type display (head mount display), a navigation system, a sound reproduction device (a car audio equipment, an audio set and the like), a personal computer, a game machine, a portable information terminal (a mobile computer, a cellular phone, a portable game machine, an electronic book, or the like), an image reproduction device including a recording medium (more specifically, a device which can reproduce a recording medium such as a digital versatile disc (DVD) and so forth, and includes a display for displaying the reproduced image), or the like. FIGS. 10A to 10C show various specific examples of such electric appliances.

Figure 10A:
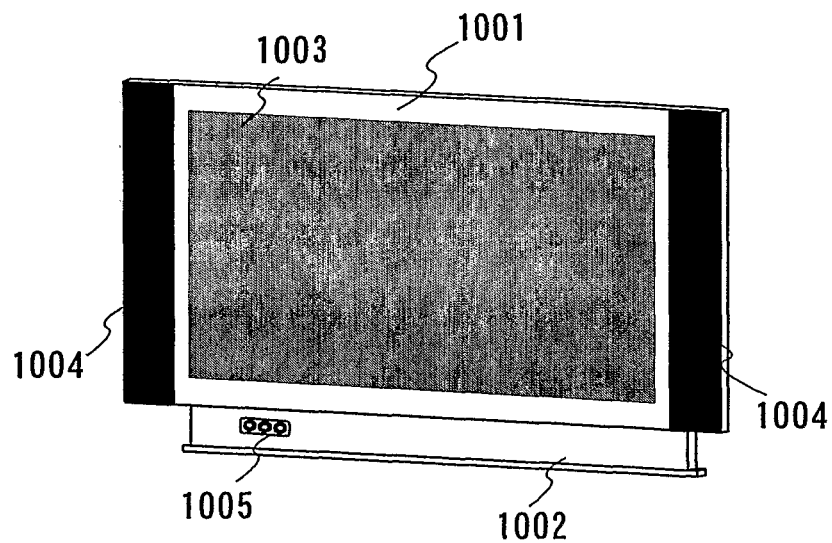
FIGS. 10A to 10C are explanatory views of electric appliances.

FIG. 10A illustrates a display device which includes a frame 1001, a support table 1002, a display portion 1003, a speaker portion 1004, a video input terminal 1005, and the like. The display device is manufactured by using the light-emitting device according to the invention for the display portion 1003. The display device includes all of the display devices for displaying information, such as a personal computer, a receiver of TV broadcasting, and an advertising display.

Figure 10B:
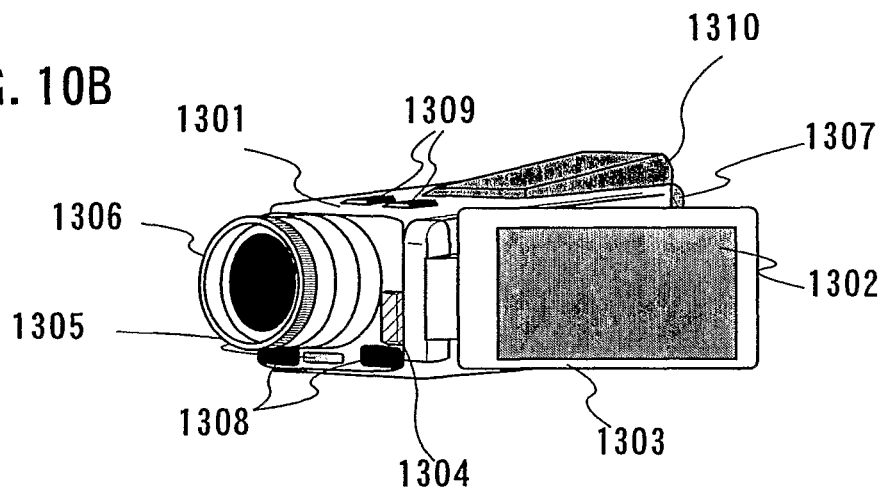

FIG. 10B illustrates a video camera which includes a main body 1301, a display portion 1302, a housing 1303, an external connecting port 1304, a remote control receiving portion 1305, an image receiving portion 1306, a battery 1307, a sound input portion 1308, an operation key 1309, an eyepiece potion 1310, and the like. The video camera is manufactured by using the light-emitting device according to the invention for the display portion 1302.

Figure 10C:
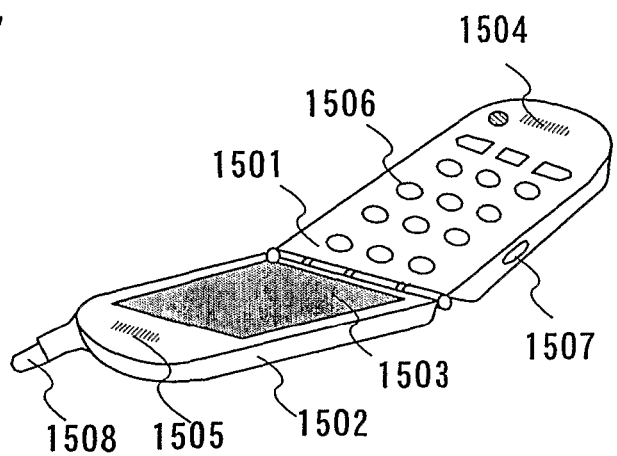

FIG. 10C illustrates a cellular phone which includes a main body 1501, a housing 1502, a display portion 1503, a sound input portion 1504, a sound output portion 1505, an operation key 1506, an external connecting port 1507, an antenna 1508, and the like. The cellular phone is manufactured by using the light-emitting device according to the invention for the display portion 1503.

As set forth above, the application range of the light-emitting device having the light-emitting element according to the invention is extremely large. Since the light-emitting element used for the light-emitting device is formed by using the light-emitting element according to the present invention, the light-emitting device has characteristics of operating at low driving voltage and long lifetime.

The invention claimed is:

1. A light-emitting element comprising:
   an anode and a cathode;
   a first layer containing a light-emitting material;
   a second layer containing a first organic compound and a first material having an electron donor property for the first organic compound, the second layer being in direct contact with the first layer; and
   a third layer containing a second organic compound and a second material having an electron acceptor property for the second organic compound, the third layer being in direct contact with the second layer,
   wherein the first layer, the second layer, and the third layer are interposed between the anode and the cathode, and the third layer is in contact with the cathode,
   and wherein the first organic compound is an organic compound having an electron transporting property.

2. A light-emitting element according to claim 1, wherein the first organic compound is a metal complex having a ligand with a π-conjugated skeleton.

3. A light-emitting element according to claim 1, wherein the first material having the electron donor property is an alkali metal, an alkaline earth metal, or a rare earth metal.

4. A light-emitting element according to claim 1, wherein the second organic compound is an organic compound having a hole transporting property.

5. A light-emitting element according to claim 1, wherein the second organic compound is an organic compound having an aromatic amine skeleton.

6. A light-emitting element according to claim 1, wherein the second material having the electron acceptor property is a metal oxide.

7. A light-emitting element according to claim 1, wherein the cathode being in contact with the third layer is made from a conductive material formed by sputtering.

8. A light-emitting element according to claim 7, wherein the conductive material is transparent to visible light.

9. A light-emitting element according to claim 1, wherein a part of the first layer comprises molybdenum oxide.

10. A light-emitting element comprising:
    an anode and a cathode;
    a first layer containing a light-emitting material;
    a second layer containing a first organic compound and metal having an electron donor property for the first organic compound, the second layer being in direct contact with the first layer; and
    a third layer containing a second organic compound and a metal oxide having an electron acceptor property for the second organic compound, the third layer being in direct contact with the second layer,
    wherein the first layer, the second layer, and the third layer are interposed between the anode and the cathode, and the third layer is in contact with the cathode,
    and wherein the first organic compound is an organic compound having an electron transporting property.

11. A light-emitting element according to claim 10, wherein the first organic compound is a metal complex having a ligand with a π-conjugated skeleton.

12. A light-emitting element according to claim 10, wherein the second organic compound is an organic compound having a hole transporting property.

13. A light-emitting element according to claim 10, wherein the second organic compound is an organic compound having an aromatic amine skeleton.

14. A light-emitting element according to claim 10, wherein the metal is an alkali metal, an alkaline earth metal, or a rare earth metal.

15. A light-emitting element according to claim 10, wherein the metal oxide comprises at least one compound selected from the group consisting of vanadium oxide, chromium oxide, molybdenum oxide, cobalt oxide, and nickel oxide.

16. A light-emitting element according to claim 10, wherein the cathode being in contact with the third layer is made from a conductive material formed by sputtering.

17. A light-emitting element according to claim 16, wherein the conductive material is transparent to visible light.

18. A light-emitting element according to claim 10, wherein a part of the first layer comprises molybdenum oxide.

* * * * *